(12) United States Patent
Saitou et al.

(10) Patent No.: US 8,648,320 B2
(45) Date of Patent: Feb. 11, 2014

(54) PHOTOELECTRIC SENSOR AND PHOTOELECTRIC SENSOR SYSTEM FOR COMPARING RECEIVED LIGHT LEVELS TO DETECT OBJECTS

(75) Inventors: Yoshitane Saitou, Kyoto (JP); Kenji Nishikido, Osaka (JP)

(73) Assignee: Anywire Corporation, Kyoto (JP)

( * ) Notice: Subject to any disclaimer, the term of this patent is extended or adjusted under 35 U.S.C. 154(b) by 694 days.

(21) Appl. No.: 12/863,279

(22) PCT Filed: Feb. 10, 2009

(86) PCT No.: PCT/JP2009/000545
§ 371 (c)(1),
(2), (4) Date: Oct. 7, 2010

(87) PCT Pub. No.: WO2010/092617
PCT Pub. Date: Aug. 19, 2010

(65) Prior Publication Data
US 2011/0049338 A1    Mar. 3, 2011

(51) Int. Cl.
*G01N 21/86* (2006.01)
(52) U.S. Cl.
USPC ........................................... 250/559.3
(58) Field of Classification Search
USPC ............. 250/221, 559.3, 559.12, 559.13
See application file for complete search history.

(56) References Cited

U.S. PATENT DOCUMENTS 5,225,691 A * 7/1993 Powers et al. ............. 250/559.4

FOREIGN PATENT DOCUMENTS

| JP | 6-177737 | 4/1994 |
|----|----------|--------|
| JP | 8-148981 | 6/1996 |
| JP | 2001-267399 | 9/2001 |
| JP | 2002-261153 | 9/2002 |
| WO | 2008/081550 | 7/2008 |

OTHER PUBLICATIONS

U.S. Appl. No. 12/480,142 to Yoshitane Saitou et al., filed Jun. 8, 2009.

* cited by examiner

*Primary Examiner* — Thanh Luu
(74) *Attorney, Agent, or Firm* — Greenblum & Bernstein, P.L.C.

(57) ABSTRACT

Disclosed are a photoelectric sensor and a photoelectric sensor system capable of accurately detecting an object without being affected by disturbance even though the object is very thin. A photoelectric sensor according to an embodiment of the invention includes a light emitting unit and a light receiving unit. The photoelectric sensor detects whether there is an object between the light emitting unit and the light receiving unit based on a variation in the intensity of a light signal received by the light receiving unit. The light receiving unit receives a light signal that is emitted from the light emitting unit to the light receiving unit without intersecting the object and a light signal that is emitted from the light emitting unit to the light receiving unit through the object, and is operated in synchronization with a light emission timing signal of the light emitting unit. The intensity of the received light signal that is not attenuated by the object is compared with the intensity of the received light signal that is attenuated by the object to detect information indicating whether there is the object.

21 Claims, 18 Drawing Sheets

FIG. 19

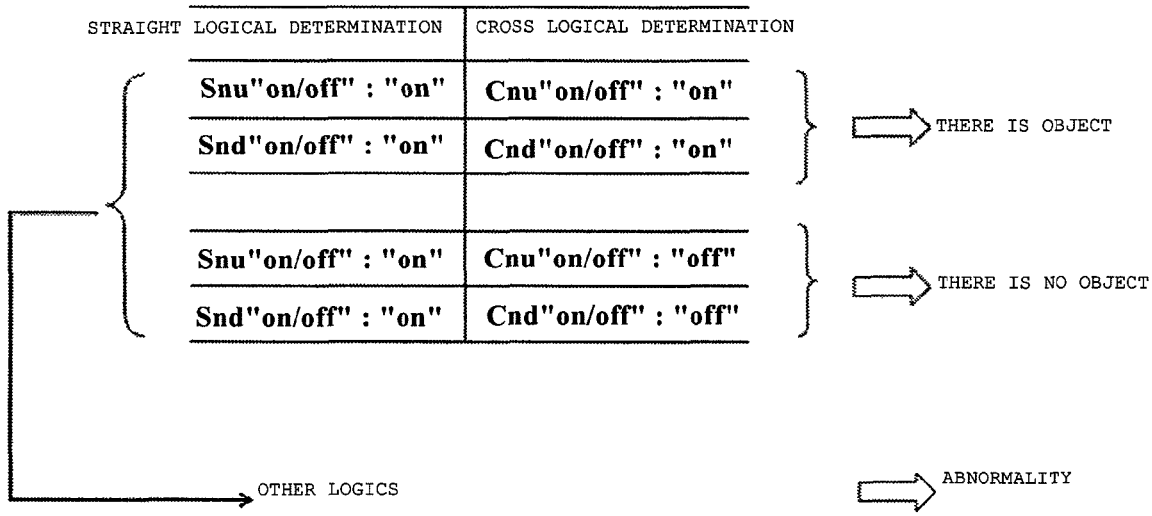

FIG. 20

RAM MEMORY MAP OF #Bn

| #Bn NUMBER | PD DATA | CROSS DIFFERENTIAL DATA | STRAIGHT LOGICAL DETERMINATION DATA | CROSS LOGICAL DETERMINATION DATA | OBJECT DETECTION DATA | ABNORMALITY DETECTION DATA |
|---|---|---|---|---|---|---|
| (nCH) #Bn RAM DATA | Dn1d | Dn2d | Dn3d | Dn4d | Dn5d | Dn6d |
| | Dn1c | Dn2c | Dn3c | Dn4c | Dn5c | Dn6c |
| | Dn1b | Dn2b | Dn3b | Dn4b | Dn5b | Dn6b |
| | Dn1a | Dn2a | Dn3a | Dn4a | Dn5a | Dn6a |
| (3CH) #B3 RAM DATA | D31d | D32d | D33d | D34d | D35d | D36d |
| | D31c | D32c | D33c | D34c | D35c | D36c |
| | D31b | D32b | D33b | D34b | D35b | D36b |
| | D31a | D32a | D33a | D34a | D35a | D36a |
| (2CH) #B2 RAM DATA | D21d | D22d | D23d | D24d | D25d | D26d |
| | D21c | D22c | D23c | D24c | D25c | D26c |
| | D21b | D22b | D23b | D24b | D25b | D26b |
| | D21a | D22a | D23a | D24a | D25a | D26a |
| (1CH) #B1 RAM DATA | D11d | D12d | D13d | D14d | D15d | D16d |
| | D11c | D12c | D13c | D14c | D15c | D16c |
| | D11b | D12b | D13b | D14b | D15b | D16b |
| | D11a | D12a | D13a | D14a | D15a | D16a |

FIG. 21

OPERATION DATA OF #Bn

| #Bn NUMBER | SEQUENTIAL LIGHT EMITTING STATE OF LD | PD DATA | CROSS DIFFERENTIAL DATA | STRAIGHT LOGICAL DETERMINATION DATA | CROSS LOGICAL DETERMINATION DATA | OBJECT DETECTION DATA | ABNORMALITY DETECTION DATA |
|---|---|---|---|---|---|---|---|
| (nCH) #Bn RAM DATA | LDnu on | ADATnuu | | Snu"on/off" | | | |
| | | ADATndu | ΔADATnd | | Cnd"on/off" | | |
| | LDnd on | ADATnud | ΔADATnu | | Cnu"on/off" | Dna"on/off" | |
| | | ADATndd | | Snd"on/off" | | Dne"on/off" | An"on/off" |
| (3CH) #B3 RAM DATA | LDnu on | ADAT3uu | | S3u"on/off" | | | |
| | | ADAT3du | ΔADAT3d | | C3d"on/off" | | |
| | LDnd on | ADAT3ud | ΔADAT3u | | C3u"on/off" | D3a"on/off" | |
| | | ADAT3dd | | S3d"on/off" | | D3e"on/off" | A3"on/off" |
| (2CH) #B2 RAM DATA | LDnu on | ADAT2uu | | S2u"on/off" | | | |
| | | ADAT2du | ΔADAT2d | | C2d"on/off" | | |
| | LDnd on | ADAT2ud | ΔADAT2u | | C2u"on/off" | D2a"on/off" | |
| | | ADAT2dd | | S2d"on/off" | | D2e"on/off" | A2"on/off" |
| (1CH) #B1 RAM DATA | LDnu on | ADAT1uu | | S1u"on/off" | | | |
| | | ADAT1du | ΔADAT1d | | C1d"on/off" | | |
| | LDnd on | ADAT1ud | ΔADAT1u | | C1u"on/off" | D1a"on/off" | |
| | | ADAT1dd | | S1d"on/off" | | D1e"on/off" | A1"on/off" |

PHOTOELECTRIC SENSOR AND PHOTOELECTRIC SENSOR SYSTEM FOR COMPARING RECEIVED LIGHT LEVELS TO DETECT OBJECTS

TECHNICAL FIELD

The present invention relates to a photoelectric sensor and a photoelectric sensor system that detect whether there is an object based on the difference between the levels of received light signals when there is the object between a light emitting element and a light receiving element.

BACKGROUND ART

In the photoelectric sensor and the photoelectric sensor system that detect whether there is an object based on the difference between the levels of the received light signals when there is the object between the light emitting element and the light receiving element, in general, a pair of the light emitting element and the light receiving element is arranged such that an optical path from the light emitting element to the light receiving element is parallel to the axis of the object. However, when the object is thin, for example, when the object is a thin plate, the optical path parallel to the axis of the object is not shielded by the object, it is difficult to detect the object. Patent Document 1 discloses a method of detecting an object using a light emitting unit that emits a light signal and a light receiving unit that is provided in a different stage in a multi-optical axis photoelectric sensor in which a plurality of light emitting units and a plurality of light receiving units are arranged so as to be opposite to each other.

According to this method, the optical path from the light emitting unit to the light receiving unit has an angle with respect to the horizontal direction, that is, the optical path is inclined. Therefore, even though an object, which is a thin plate, is arranged such that the axis thereof is aligned with the horizontal direction, the optical path is shielded by the object. As a result, it is possible to detect the object.

Patent Document 1: Japanese Patent Application Laid-Open (JP-A) No. 8-148981

DISCLOSURE OF THE INVENTION

Problems to be Solved by the Invention

However, when the object is very thin, in some cases, it is difficult to detect the object using the method disclosed in Patent Document 1. In addition, when the object is translucent, a variation in the level of the light signal received by the light receiving unit is small even though the object shields the optical path, and the detection result is inaccurate due to the influence of disturbance, such as illumination or reflected light in the periphery of the light receiving unit.

An object of the invention is to provide a photoelectric sensor and a photoelectric sensor system capable of accurately detecting an object without being affected by disturbance even though the object is very thin.

Means for Solving the Problems

According to an aspect of the invention, a photoelectric sensor includes a light emitting unit and a light receiving unit. The photoelectric sensor detects whether there is an object between the light emitting unit and the light receiving unit based on a variation in the intensity of a light signal received by the light receiving unit. The light receiving unit receives a light signal that is emitted from the light emitting unit to the light receiving unit without intersecting the object and a light signal that is emitted from the light emitting unit to the light receiving unit through the object, and is operated in synchronization with a light emission timing signal of the light emitting unit. The level of the received light signal that is not attenuated by the object is compared with the level of the received light signal that is attenuated by the object to detect information indicating whether there is the object.

The comparison between the levels may be performed at the light emission timing of the light emitting unit.

The light receiving unit may include: a first light receiving element that receives the light signal which is emitted from the light emitting unit to the light receiving unit without intersecting the object; and a second light receiving element that receives the light signal which is emitted from the light emitting unit to the light receiving unit through the object. The first and second light receiving elements may be operated in synchronization with the light emission timing signal of the light emitting unit. The level of the light signal that is not attenuated by the object and is received by the first light receiving element may be compared with the level of the light signal that is attenuated by the object and is received by the second light receiving element to detect the information indicating whether there is the object. In this case, two light receiving elements receive the light signal emitted from one light emitting element. In the following description, in some cases, this type of photoelectric sensor is referred to as a first photoelectric sensor.

The light emitting unit may include: a first light emitting element that is arranged such that the light signal is emitted to the first light receiving element without intersecting the object and to the second light receiving element through the object; and a second light emitting element that is arranged such that the light signal is emitted to the second light receiving element without intersecting the object and to the first light receiving element through the object. A pair of the first light emitting element and the first light receiving element and a pair of the first light emitting element and the second light receiving element may form a first set. A pair of the second light emitting element and the first light receiving element and a pair of the second light emitting element and the second light receiving element may form a second set. In the first set, the level of the light signal that is not attenuated by the object and is received by the first light receiving element may be compared with the level of the light signal that is attenuated by the object and is received by the second light receiving element so as to detect information indicating whether there is the object. In the second set, the level of the light signal that is attenuated by the object and is received by the first light receiving element may be compared with the level of the light signal that is not attenuated by the object and is received by the second light receiving element so as to detect information indicating whether there is the object. The information obtained from the first set and the information obtained from the second set are checked so as to detect information indicating whether there is the object.

In this case, the comparison between the levels of the light signals in the first set may be performed at the light emission timing of the first light emitting element, and the comparison between the levels of the light signals in the second set may be performed at the light emission timing of the second light emitting element.

The light emitting unit may include first and second light emitting elements and the first and second sets. When the detection of an object is not performed by the double check of information indicating whether there is the object using the information indicating whether there is the object, which is obtained from the first set, and the information indicating whether there is the object, which is obtained from the second set, the abnormal state of the object and/or a sensor failure may be detected. The photoelectric sensor may have a multi-stage structure and detect a plurality of objects. The second light emitting element in the second set may be used as the first light emitting element in the first set that is used to detect another object adjacent to the object subjected to a detecting process related to the second set.

The light emitting unit may include: a first light emitting element that emits a light signal to the light receiving unit without intersecting the object; and a second light emitting element that emits a light signal to the light receiving unit through the object. The level of a received time-division light signal generated from the received light signal which is emitted from the first light emitting element and is not attenuated by the object may be compared with the level of a received time-division light signal generated from the received light signal which is emitted from the second light emitting element and is attenuated by the object to detect the information indicating whether there is the object. In this case, one light receiving element receives the light signals emitted from two different light emitting elements. In the following description, in some cases, this type of photoelectric sensor is referred to as a second photoelectric sensor. In addition, two received light signals are generated by one light receiving element. When one of the two received light signals is received from one light emitting element and the other received light signal is received from the other light emitting element, that is, when the light signals are time-divisionally received, the former received light signal is referred to as a received time-division light signal, and the latter received light signal is referred to as another received time-division light signal.

The light receiving unit may include: a first light receiving element that receives a light signal which is emitted from the first light emitting element and is not attenuated by the object and a light signal which is emitted from the second light emitting element and is attenuated by the object; and a second light receiving element that receives a light signal which is emitted from the second light emitting element and is not attenuated by the object and a light signal which is emitted from the first light emitting element and is attenuated by the object. A pair of the first light emitting element and the first light receiving element and a pair of the second light emitting element and the first light receiving element may form a first set. A pair of the second light emitting element and the second light receiving element and a pair of the first light emitting element and the second light receiving element may form a second set. In the first set, the level of a time-division light signal that is not attenuated by the object and is received by the first light receiving element may be compared with the level of a time-division light signal that is attenuated by the object and is received by the first light receiving element so as to detect information indicating whether there is the object. In the second set, the level of a time-division light signal that is attenuated by the object and is received by the second light receiving element may be compared with the level of a time-division light signal that is not attenuated by the object and is received by the second light receiving element so as to detect information indicating whether there is the object. Information obtained from the first set and the information obtained from the second set are checked so as to detect information indicating whether there is the object. In this case, the levels may be compared with each other at the time-division light emission timing of the first and second light emitting elements.

In the above-mentioned structures, a pair of the light emitting unit and the light receiving unit may form one unit.

According to another aspect of the invention, a photoelectric sensor system includes a plurality of the photoelectric sensors according to the above-mentioned aspect; a first manager station that is connected to a series of the light emitting units; and a second manager station that is connected to a series of the light receiving units corresponding to the light emitting units. The first manager station generates the light emission timing signal, and the second manager station generates a timing signal of a received light signal synchronized with the light emission timing signal.

In the photoelectric sensor system according to the above-mentioned aspect of the invention, a plurality of light emitting units and light receiving units among a series of the light emitting units and a series of the light receiving units may be connected to a common data signal line, and information indicating whether there is an object and information of the abnormal state of the object and/or a sensor failure may be transmitted to a host parent station.

The photoelectric sensor system according to the invention includes a photoelectric sensor that includes the light emitting unit having first and second light emitting elements and the first and second sets. In this structure, when the detection of an object is not performed by the double check of information indicating whether there is the object using information indicating whether there is the object, which is obtained from the first set, and information indicating whether there is the object, which is obtained from the second set, the abnormal state of the object and/or a sensor failure is detected.

Effects of the Invention

In the photoelectric sensor according to the above-mentioned aspect of the invention, the light receiving unit functions as a reference sensor and a detection sensor. That is, the light receiving unit functions as a sensor (reference sensor) that receives a light signal which is not shielded by an object and a sensor (detection sensor) that receives a light signal which is shielded by the object when the object is disposed between the light emitting unit and the light receiving unit. The signal of the reference sensor is compared with the signal of the detection sensor to detect whether there is an object. In this case, the light receiving unit serving as the detection sensor receives the light signal which is emitted from the light emitting unit to the light receiving unit through the object. Therefore, the received light signal is attenuated when there is an object. In addition, it is possible to exclude the influence of disturbance by comparing the two detection results, that is, by calculating the difference between the levels of the two received light signals. Therefore, even though an object is very thin, it is possible to accurately detect the object without being affected by disturbance.

The comparison between the level of the light signal which is not attenuated by the object and is received by the light receiving unit and the level of the light signal that is attenuated by the object and is received by the light receiving unit is performed at the light reception completion timings of the two received light signals, that is, at the light emission timing of the light emitting unit in the first photoelectric sensor and at the light emission timing of the second light emitting element in the second photoelectric sensor. In this case, each stage detects whether there is an object. Therefore, it is possible to reduce a response time to the detection of an object and obtain a high response speed.

The light emitting unit includes the first and second light emitting elements and the light receiving unit includes the first and second light receiving elements. In addition, a pair of the first light emitting element and the first light receiving element and a pair of the first light emitting element and the second light receiving element form the first set, and a pair of the second light emitting element and the first light receiving element and a pair of the second light emitting element and the second light receiving element form the second set. In this way, a double detection structure is formed. As a result, it is possible to improve the detection accuracy of an object. In this case, in the first photoelectric sensor, the comparison between the levels in the first set is performed at the light emission timing of the first light emitting element, and the comparison between the levels in the second set is performed at the light emission timing of the second light emitting element. In addition, in the second photoelectric sensor, the comparison between the levels is performed at the light emission timing of the second light emitting element. In this case, each stage detects whether there is an object. Therefore, it is possible to reduce a response time to the detection of an object and obtain a high response speed. In addition, when the detection of an object is not performed by the double check of information indicating whether there is the object, it is possible to detect whether an object is abnormally held (inclined) or a sensor failure, based on a logical value obtained by logically determining a plurality of received light signals.

In addition, the light emitting unit includes the first and second light emitting elements and the light emitting elements and the light receiving elements form the first and second sets. In this case, scattering light from the light emitting element is used, and the second light emitting element in the second set is used as the first light emitting element in the first set that is used to detect an object adjacent to the object which is subjected to a detecting process related to the second set. In this way, it is possible to reduce the number of light emitting elements by half and thus achieve a simple structure.

A pair of the light emitting unit and the light receiving unit forms one unit. According to this structure, it is possible to arbitrarily set the gap between the stages and the invention can be applied to detect objects with various thicknesses and sizes. In addition, it is possible to extend the application range of the invention. For example, the invention can be applied to detect objects with different shapes.

The photoelectric sensor system according to the invention includes the photoelectric sensor according to the invention. Therefore, even though an object is very thin, it is possible to accurately detect the object without being affected by disturbance. In addition, it is possible to reliably detect whether there is an object by reducing a response time to the detection of the object and constructing a double detection structure. It is possible to detect whether an object is abnormally held (inclined) or a sensor failure, based on a logical value obtained by logically determining a plurality of received light signals and improve the reliability of the photoelectric sensor system. Since the gap between the stages can be arbitrarily set, it is possible to extend the application range of the invention. For example, the photoelectric sensor can be applied to detect objects with different thicknesses or sizes, or shapes.

Logical determination for detecting the abnormal holding state (inclination) of an object or a sensor failure may be performed by the photoelectric sensor or a determining device (for example, a PLC or a main computer) included in the photoelectric sensor system.

BRIEF DESCRIPTION OF THE DRAWINGS

FIG. 19 is a diagram illustrating the logical determination of the photoelectric sensor system;

FIG. 20 is a diagram illustrating a RAM memory map of a child station input unit with an address #Bn in the photoelectric sensor system;

FIG. 21 is a diagram illustrating the operation data of the child station input unit with the address #Bn in the photoelectric sensor system;

BEST MODE FOR CARRYING OUT THE INVENTION

Hereinafter, a first photoelectric sensor and a photoelectric sensor system including the photoelectric sensor according to an embodiment of the invention will be described with reference to the accompanying drawings.

Figure 1:
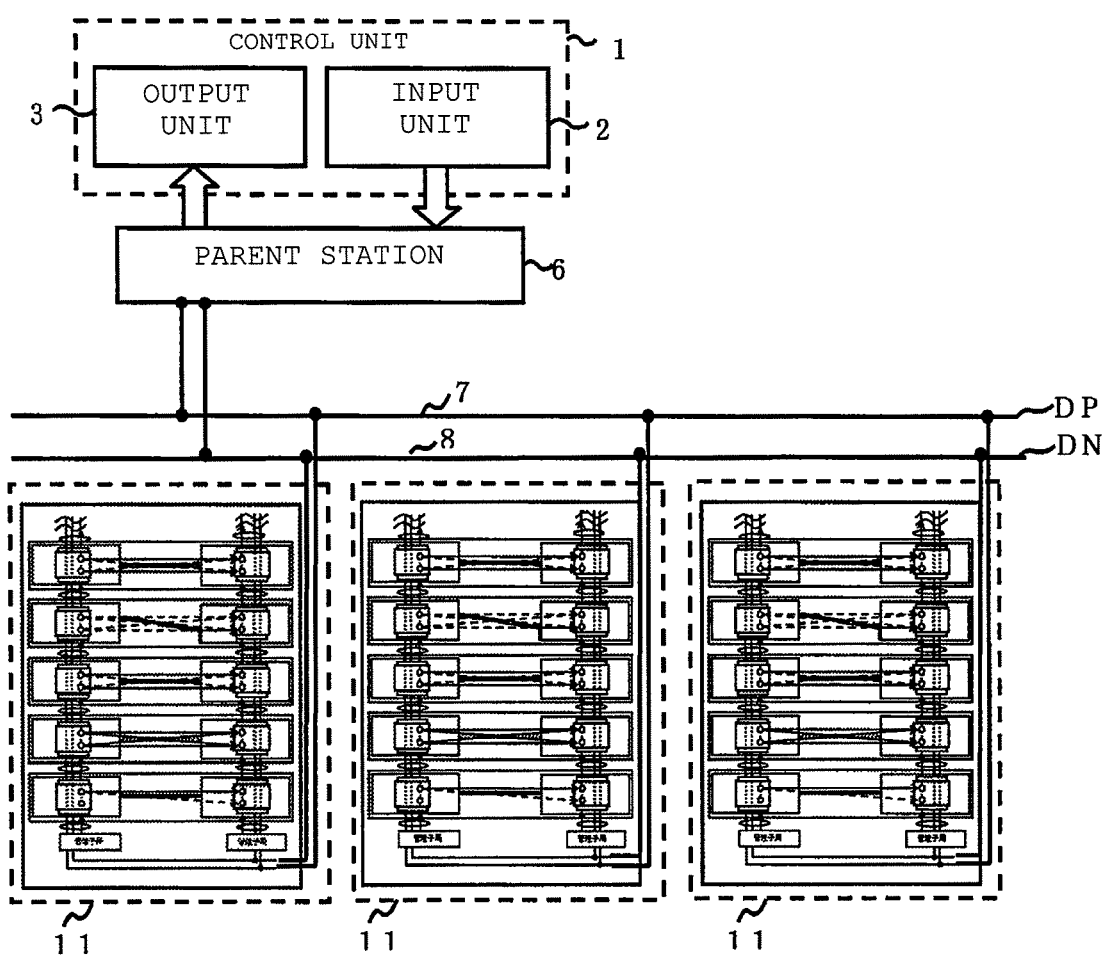
FIG. 1 is a diagram illustrating the overall structure of a photoelectric sensor system according to an embodiment of the invention.
Figure 2:
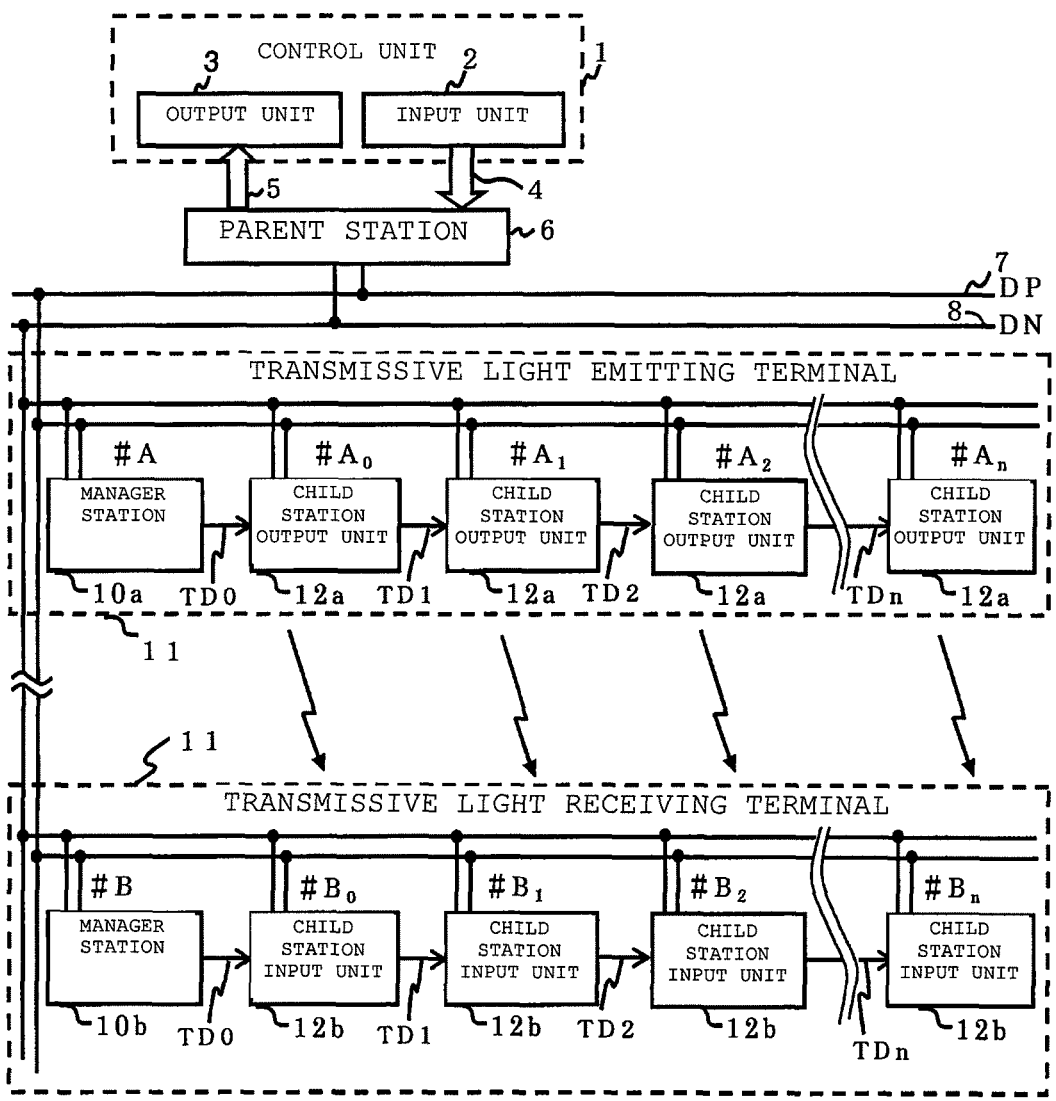
FIG. 2 is a block diagram illustrating the photoelectric sensor system.

FIG. 1 is a diagram illustrating the overall structure of a photoelectric sensor system according to an embodiment of the invention, and FIG. 2 is a block diagram illustrating the photoelectric sensor system. In the photoelectric sensor system, a plurality of photoelectric sensors 11 is connected to a DP signal line 7 and a DN signal line 8, which are common data signal lines. The photoelectric sensor 11 includes manager stations 10a and 10b, a plurality of child station input units 12b that is cascaded to the manager station 10b, and a plurality of child station output units 12a that is cascaded to the manager station 10a. The child station input unit 12b corresponds to a light receiving unit according to the invention, and the child station output unit 12a corresponds to a light emitting unit according to the invention. The photoelectric sensor 11 detects whether there is an object between the child station output unit 12a and the child station input unit 12b. For example, a system detects the kind of object on the shelf of a shelf structure. The system detects the position or state of a shelf on which a semiconductor wafer or a liquid crystal display panel is placed. However, the object to be detected is not limited thereto, but indeterminate objects or objects with different shapes may be used as the object.

The manager stations 10a and 10b, the child station input units 12b, and the child station output units 12a of the photoelectric sensor 11 share data with a parent station 6. The parent station 6 receives or transmits data from or to a control unit 1 with parallel signals. That is, a control unit output signal 4, which is a parallel output signal, is transmitted from an output unit 2 of the control unit 1 to the parent station 6, and an input unit 3 receives a parallel input signal as a control unit input signal 5 from the parent station 6. The control unit 1, which is a host system, receives or transmits parallel signals from or to the parent station 6, and the communication therebetween is performed at a high speed. The parent station 6 is connected to the DP signal line 7 and the DN signal line 8 and is connected to the photoelectric sensors 11 that are connected to the signal lines. The child station input units 12b and the child station output units 12a of the photoelectric sensor 11 are also connected to the DP signal line 7 and the DN signal line 8. The control unit 1 can control all of the control and monitoring data through the parent station 6. In FIG. 1, the manager stations 10a and 10b are included in the structure of the photoelectric sensor 11, but they may be provided separately from the photoelectric sensor 11.

Figure 3:
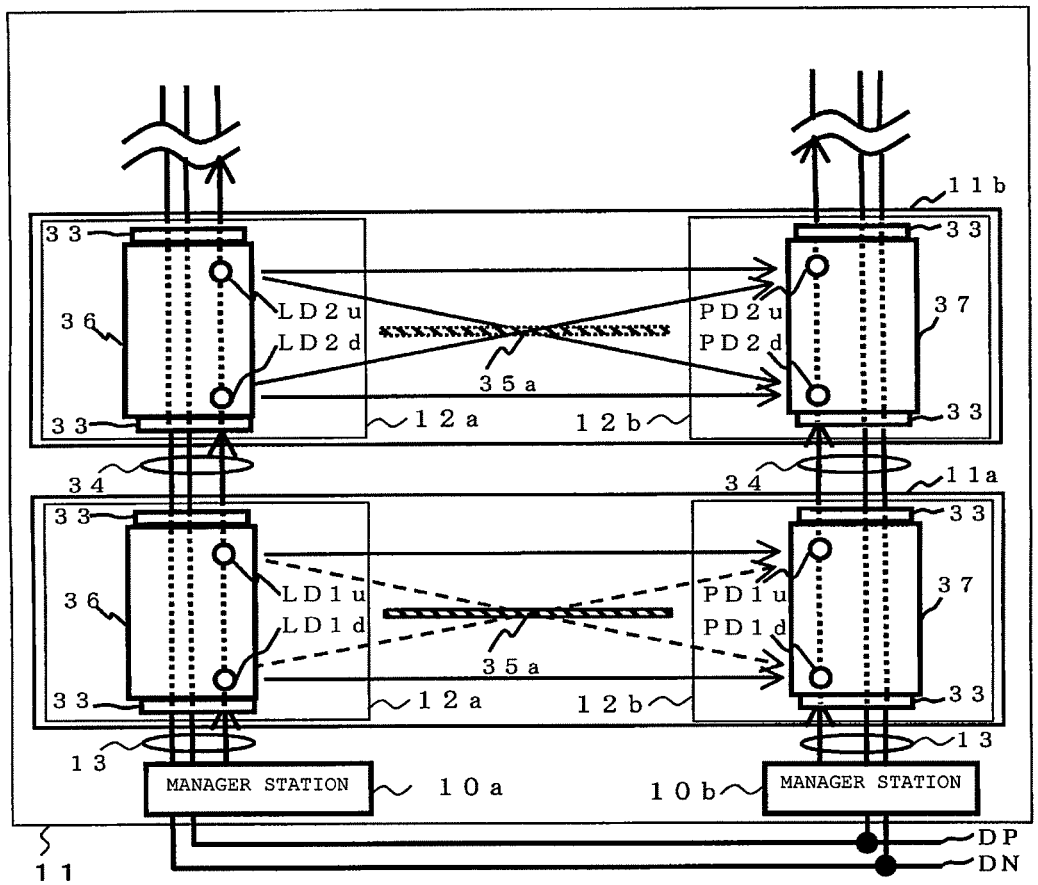
FIG. 3 is a diagram illustrating the structure of a photoelectric sensor of the photoelectric sensor system.

FIG. 3 is an enlarged view illustrating the structure of the photoelectric sensor. As shown in FIG. 3, the photoelectric sensor 11 is formed by connecting a plurality of sensor units 11a and 11b each having a pair of the child station output unit 12a and the child station input unit 12b. The number of sensor units is not particularly limited, but a necessary number of sensor units may be connected to each other, if necessary. The photoelectric sensor also includes a plurality of sensor units connected to each other, but FIG. 3 shows only two sensor units for convenience of illustration.

The manager stations 10a and 10b and the sensor units 11a are connected to each other by crossover lines 13, and the sensor unit 11a and the sensor unit 11b in the next stage are connected by child station interconnects 34. Similarly, the sensor units in the stages after the sensor unit 11b are connected to each other by the child station interconnects 34.

Connectors 33 are used for connection using the crossover lines 13 or the child station interconnects 34. In this case, connection is simplified. When a plurality of child station interconnects 34 is arranged at equal intervals, the length of the child station interconnect 34 is standardized to simplify a wiring operation. When the child station interconnects 34 are not arranged at equal intervals, it is possible to simplify a wiring operation and a connection operation by adjusting the length of the child station interconnect 34 according to the interval between the child station interconnects 34.

The manager station 10a is a light-emission-side manager station and transmits cascade signals to the plurality of child station output units 12a that is cascaded and belongs to the manager station 10a to set the operation timing of the plurality of child station output units 12a. The manager station 10b is a light-reception-side manager station, and transmits the cascade signals to the plurality of child station input units 12b that is cascaded and belongs to the manager station 10b to set the operation timing of the plurality of child station input units 12b.

The sensor units 11a and 11b each including the child station output unit 12a, which is a light emitting unit, and the child station input unit 12b, which is a light receiving unit, are transmissive sensors, and an object 35a to be detected is accommodated between the child station output unit 12a and the child station input unit 12b. The child station input unit 12b of the sensor unit 11a includes a first light receiving element PD1d that receives a light signal which is emitted from a light emitting element LD1d of the child station output unit 12a to the child station input unit 12b without intersecting the object 35a and a second light receiving element PD1u that receives a light signal which is emitted from the light emitting element LD1d to the child station input unit 12b through the object 35a. The child station output unit 12a includes a second light emitting element LD1u that emits a light signal so as to be incident on the second light receiving element PD1u without intersecting the object 35a and on the first light receiving element PD1d through the object 35a, in addition to the light emitting element LD1d. The sensor unit 11b connected to the next stage of the sensor unit 11a has the same structure as described above. In the following description, numbers are given to the light emitting elements and the light receiving elements such that number 1 is given to the sensor unit 11a in the first stage, number 2 is given to the sensor unit 11b in the next stage, and number n is given to the sensor unit 11n in an n-th stage. Therefore, for example, the second light emitting element of the sensor unit 11b is represented by LD2u, and the second light emitting element of the sensor unit 11n is represented by LDnu.

The light signal emitted from the light emitting element LDnd to the first light receiving element PDnd becomes a received light signal that is not shielded by the object 35a, and is also a reference signal compared with the case in which the light signal is shielded by the object 35a. The light signal obliquely emitted from the light emitting element LDnd to the second light receiving element PDnu is shielded by the object 35a, and the light signal received by the second light receiving element PDnu is attenuated and becomes a detection signal with a very low level. The level of the reference signal and the level of the detection signal are compared each other to detect information indicating whether there is the object 35a. Therefore, the detection is less likely to be affected by the periphery of the light receiving element.

The determination of detection by the comparison between the reference signal and the detection signal is performed at the light emission timing of the light emitting unit. The timing of the detection determination is not particularly limited. For example, the detection determination may be performed by the operation of a timer provided in each sensor unit, or it may be performed after all of the sensor units are circulated. However, when the determination of detection by the comparison between the reference signal and the detection signal is performed at the light emission timing of the light emitting unit, a response time to the detection of the object is reduced, as compared with when the detection determination is performed after all of the sensor units are circulated. As a result, it is possible to achieve a high response speed. Details of the detection determination will be described below. When the detection determination is performed by the operation of the timer provided in each sensor unit, an area for storing the reference signal and the detection signal is provided, and the child station input unit 12*b* performs the comparison operation. The storage area will be described below.

The light signal emitted from the second light emitting element LDnu to the second light receiving element PDnu becomes a received light signal that is not shielded by the object 35*a* and is also a reference signal compared with the case in which the light signal is shielded by the object 35*a*. The light signal obliquely emitted from the second light emitting element LDnu to the first light receiving element PDnd is shielded by the object 35, and the light signal received by the first light receiving element PDnd is attenuated and becomes a detection signal with a very low level. A pair of the light emitting element LDnd and the first light receiving element PDnd and a pair of the light emitting element LDnd and the second light receiving element PDnu form a first set, and a pair of the second light emitting element LDnu and the first light receiving element PDnd and a pair of the second light emitting element LDnu and the second light receiving element PDnu form a second set. It is possible to check and detect information indicating whether there is an object twice using information indicating whether there is the object, which is obtained from the first set, and information indicating whether there is the object, which is obtained from the second set. Therefore, it is possible to detect the object 35*a* using a sensor with high reliability and high detection accuracy. The differences between the levels of the reference signal and the detection signal in the first set are compared at the light emission timing of the light emitting element LDnd, and the differences between the levels of the reference signal and the detection signal in the second set are compared at the light emission timing of the second light emitting element LDnu.

As described above, the manager station 10*a* and the manager station 10*b* transmit the cascade signal (hereinafter, referred to as a signal TDn) to the child station output units 12*a* and the child station input unit 12*b* cascaded thereto at the same timing. The child station input unit 12*b* or the child station output unit 12*a* receives the address timing of the station transmitted by the signal TDn. As described above, since the manager stations 10*a* and 10*b* are connected to the DP signal line 7 and the DN signal line 8, it is possible to generate a signal TD0 for determining the operation timing of the photoelectric sensor 11 from a transmission clock signal, which will be described below. Therefore, even when the distance between the child station output unit 12*a* and the child station input unit 12*b* is long, the manager stations 10*a* and 10*b* can generate their own address timings and transmit the cascade signal to a pair of the child station output unit 12*a* and the child station input unit 12*b*.

The child station input unit 12*a* or the child station output unit 12*b* receiving the signal TD0 generates the address timing of the next child station input unit 12*a* or the next child station output unit 12*b* cascaded thereto by the child station interconnects 34 and transmits the signal TDn to the next child station input unit 12*a* or the next child station output unit 12*b*. For example, when the addresses of a plurality of child station output units 12*a* are #A0, #A1, #A2, . . . , and the addresses of a plurality of child station input units 12*b* are #B0, #B1, #B2, . . . , the child station output unit 12*a* with the address #A0 which receives the cascade signal (signal TD0) from the manager station 10*a* emits light as an output signal from the light emitting element to the child station input units 12*b* at the timing of the signal TDn. The child station input unit 12*b* with the address #B0 that receives the cascade signal (signal TD0) from the manager station 10*b* receives the light signal from the light receiving element at the timing of the signal TDn. As such, a pair of the child station output unit 12*a* with the address #A0 and the child station input unit 12*b* with the address #B0 is operated. Similarly, a pair of the child station output unit 12*a* with the address #A1 subsequent to the child station output unit 12*a* with the address #A0 and the child station input unit 12*b* with the address #B1 subsequent to the child station input unit 12*b* with the address #B0 emits and receives light at the same timing. That is, in this embodiment, a plurality of pairs of the child station output units 12*a* and the child station input units 12*b* forms a multi-optical axis photoelectric sensor in which the pairs of the child station output units 12*a* and the child station input units 12*b* are sequentially switched at the timing of the cascade signal (signal TDn) to detect an object. The detection of an object between the child station output unit 12*a*, which is a light emitting unit, and the child station input unit 12*b*, which is a light receiving unit, is determined based on a variation in the intensity of the received light signal.

As shown in FIG. 1, in the photoelectric sensor system, a plurality of photoelectric sensors 11 including a series of sensor units 11*a*, 11*b*, . . . , 11*n* is connected to each other. Therefore, the addresses (addresses for identifying the plurality of photoelectric sensors 11) of the manager stations 10*a* and 10*b* connected to a pair of the child station output unit 12*a* and the child station input unit 12*b* (of the same sensor unit) need to be identical to each other. The cascade signals (a signal TD1 to a signal TDn) generated by the manager stations 10*a* and 10*b* connected to the child station output units 12*a* and the child station input units 12*b* are transmitted to the child station output units 12*a* with the addresses #A0 to #An and the child station input units 12*b* with the addresses #B0 to #Bn at the same time. Therefore, the emission of light and the receiving of light are synchronized with each other. In FIG. 2, the light signal (represented by an arrow) emitted from the child station output unit 12*a* with the address #An to the child station input unit 12*b* with the address #Bn (for example, the light signal from the child station output unit 12*a* with the address #A0 to the child station input unit 12*b* with the address #B0 and the light signal from the child station output unit 12*a* with the address #A1 to the child station input unit 12*b* with the address #B1) indicates that a plurality of child station output units 12*a* and a plurality of child station input units 12*b* are synchronized with each other to emit and receive light at the timing of the cascade signals.

Figure 4:
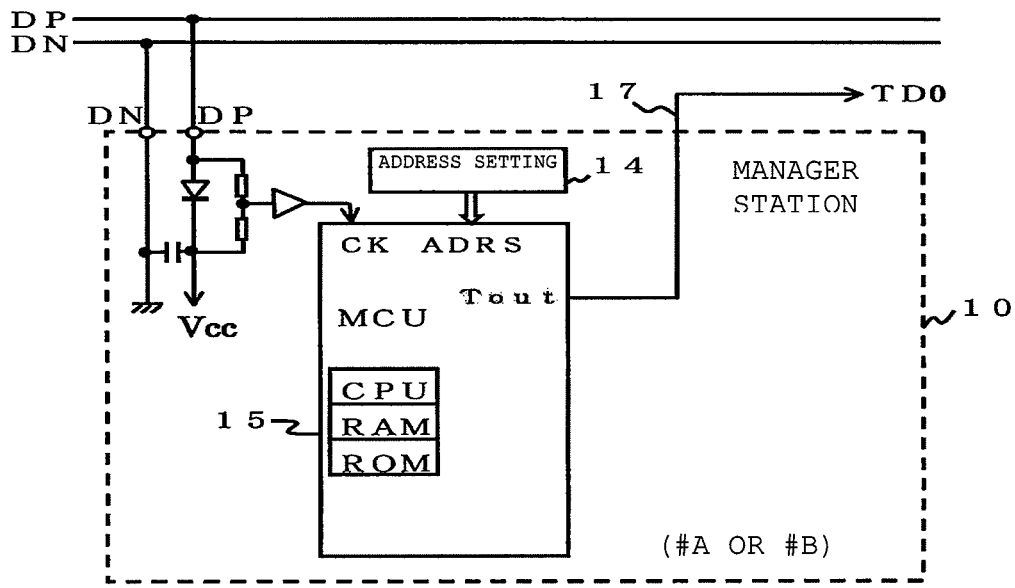
FIG. 4 is a functional block diagram illustrating a manager station of the photoelectric sensor system.
Figure 5:
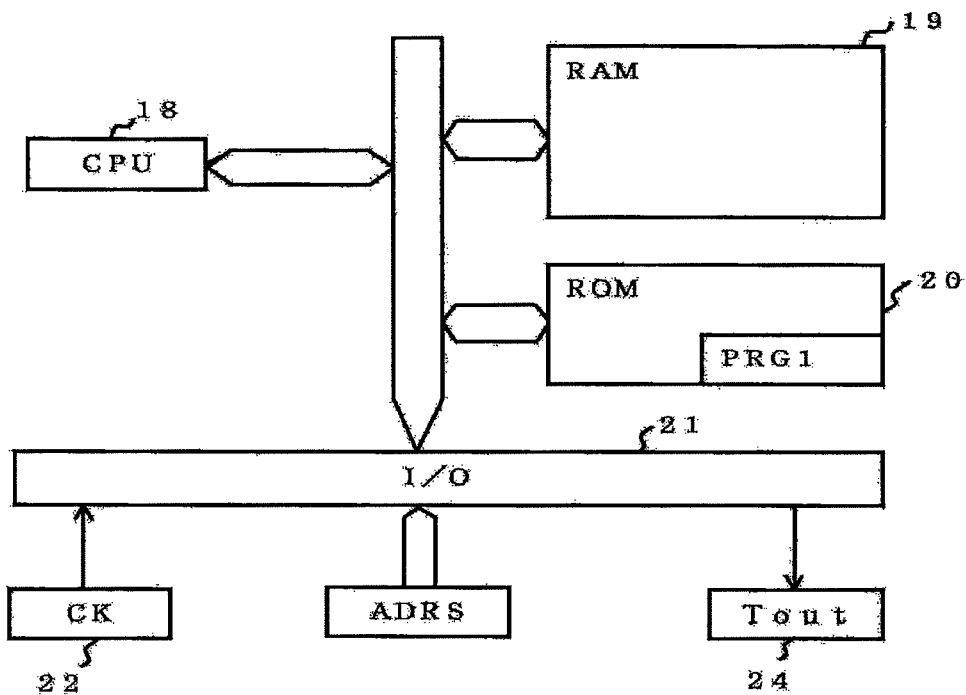
FIG. 5 is a system block diagram illustrating the manager station of the photoelectric sensor system.

FIG. 4 is a functional block diagram illustrating the manager station of the photoelectric sensor system, and FIG. 5 is a system block diagram illustrating the manager station. The functional block diagram of the manager station 10*a* connected to the child station output units 12*a* is the same as that of the manager station 10*b* connected to the child station input units 12*b*. Therefore, FIGS. 4 and 5 show both the manager station 10*a* and the manager station 10*b*, and the manager station is represented by reference numeral 10.

As shown in FIG. 4, the manager station 10 is connected to the DP signal line 7 and the DN signal line 8 through DP/DN connection terminals. In the manager station 10, first, a power supply unit including a capacitor and a diode for obtaining power for the manager station from the signal on which the power is superimposed and which is transmitted from the DP signal line 7 and the DN signal line 8 generates power. The power that is superimposed on the signal line is charged to the capacitor through the diode and a power supply voltage Vcc is obtained. The power supply voltage Vcc serves as a power source in the manager station 10. A method of superimposing power on the transmission signal to obtain power for the station reduces the number of wiring lines. At the same time, the manager station 10 extracts a signal CK from the DP signal line 7 and the DN signal line 8 and transmits the signal to an MCU 15. The manager station 10 has an address setting unit 14 and sets its own address using the address setting function.

The MCU 15 analyzes input/output signals based on a clock signal CK included in the signal that is transmitted through the DP signal line 7 and the DN signal line 8 and stores the data information of each child station in a storage area. The clock signal CK includes a start signal with a long period and a transmission clock with a short period. The MCU 15 recognizes the start signal, counts the transmission clocks, and sets the timing at which the address of the station is identical to that set by the address setting unit 14 as a station operation timing. The manager station 10 obtains the address timing of the station from the signal CK based on the transmission clock and transmits the signal TD0 as the cascade signal to the child station input unit 12b with the address #B0 or the child station output unit 12a with the address #A0 connected to the manager station 10 through a Tout terminal. The MCU 15 includes a CPU 18, a RAM 19, and a ROM 20, and is operated by the program stored in the ROM 20 according to the flow of a program flowchart, which will be described below. The CPU 18 includes an internal clock generating circuit and controls the MCU 15 based on the internal clock.

As described above, the DP signal line 7, the DN signal line 8, and a cascade line 17 for transmitting the signal TDn which form the crossover lines 13 or the child station interconnects 34 are connected to the subsequent child station input unit 12b with the address #B0 or the subsequent child station output unit 12a with the address #A0 by the connector 33. Therefore, it is easy to perform a wiring operation.

As shown in FIG. 5, the CPU 18 is connected to the RAM 19 and the ROM 20 by the internal bus of the MCU 15, has the internal clock, and performs data communication with the RAM 19 and the ROM 20 at the timing of the clock. In addition, the CPU 18 is connected to an I/O bus 21. The MCU 15 starts when power is turned on and is initialized by an initializing program stored in the ROM 20. Then, the system is operated by a program PRG1 stored in the ROM 20. The RAM 19 has a data area, stores data obtained from the signal CK, and transmits or receives a signal Tout, which is the cascade signal transmitted to the subsequent child station, to or from the outside through the I/O bus 21 at the timing corresponding to a signal ADRS received from the address setting unit.

Figure 6:
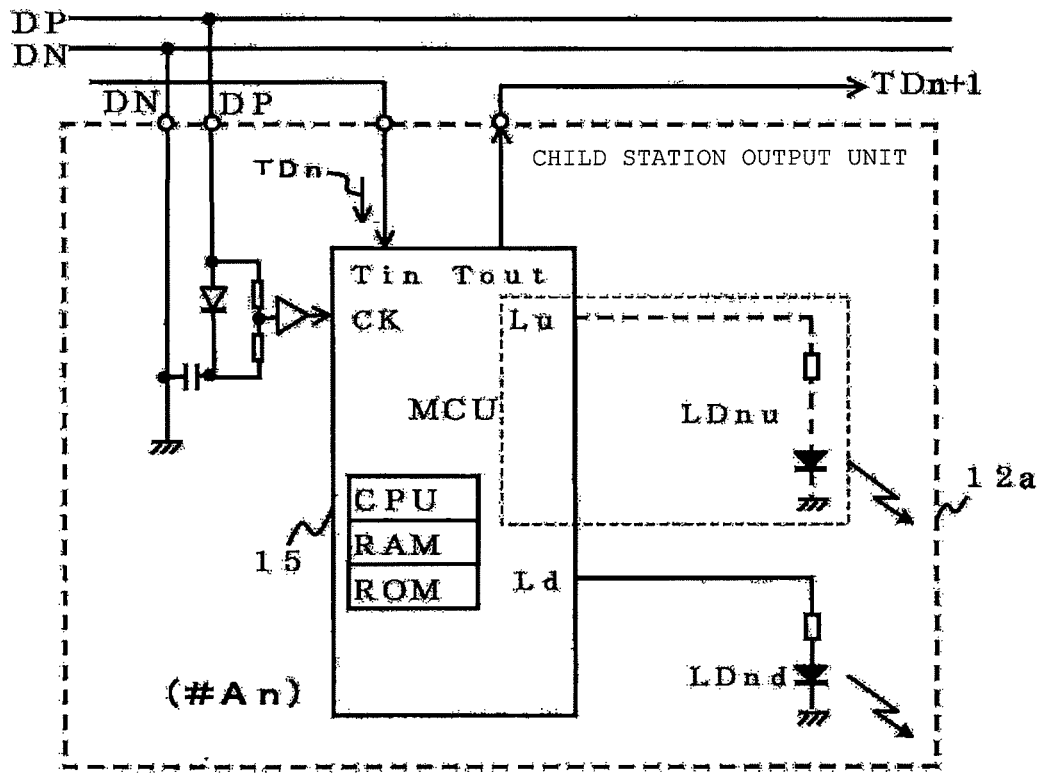
FIG. 6 is a system diagram illustrating a child station output unit of the photoelectric sensor system.
Figure 7:
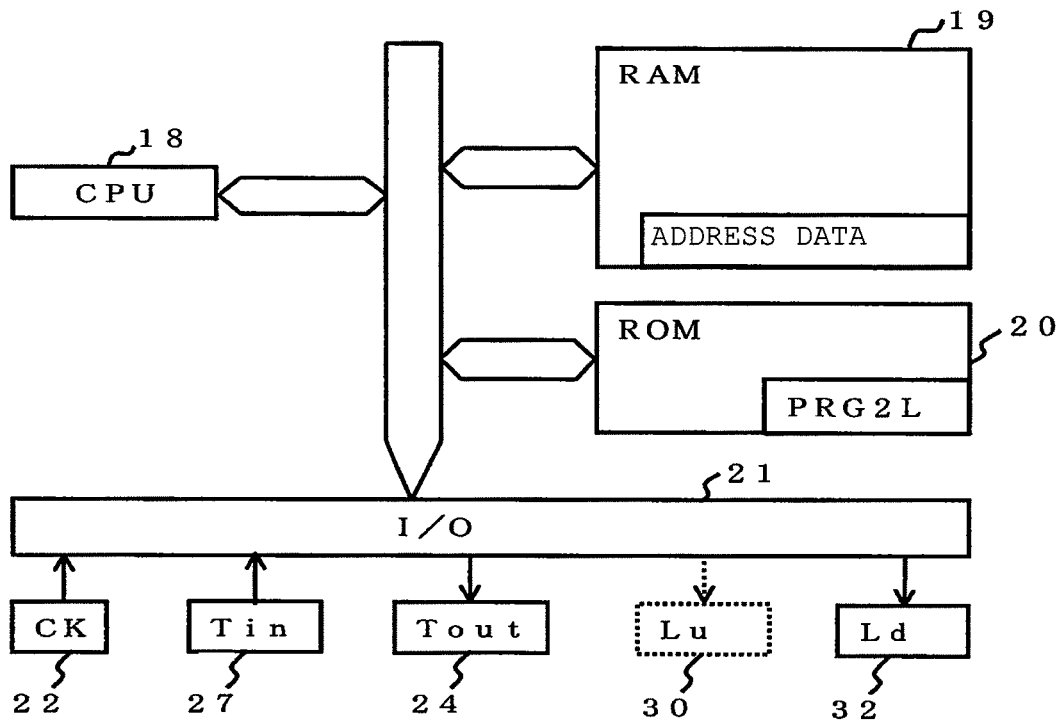
FIG. 7 is a system block diagram illustrating the child station output unit of the photoelectric sensor system.

FIG. 6 is a diagram illustrating the system structure of the child station output unit with the address #An, and FIG. 7 is a system block diagram illustrating the child station output unit. Components having the same functions as those of the manager station are denoted by the same reference numerals.

As shown in FIG. 6, similar to the manager station 10, the child station output unit 12a generates power from the signal transmitted through the DP signal line 7 and the DN signal line 8. The child station output unit 12a with the address #A0 that is connected to the manager station 10a receives the signal TD0, which is the cascade signal, from the manager station 10a through a Tin terminal 27 and outputs a signal TD1 to the child station output unit 12a with the address #A1 through a Tout terminal 24. Similarly, the child station output unit 12a with the address #An receives the signal TDn as the cascade signal from the child station output unit 12a with the address #An−1 through the Tin terminal 27 and outputs a signal TDn+1 to the child station output unit 12a with the address #An+1 through the Tout terminal 24. That is, the child station output unit 12a outputs a cascade signal obtained by adding 1 to its own address as the signal TDn to the child station output unit 12a in the next stage. The MCU 15 includes an independent clock signal generating circuit and performs I/O control through the RAM 19, the ROM 20, and the I/O bus 21 based on the clock signal.

In the child station output unit 12a receiving the signal TDn, the CPU 18 sequentially transmits signals from an Ld terminal 32 to a light emitting diode LDnd at the timing when the signal TDn is received in the order of the cascade signals transmitted from the manager station 10a, and the light emitting diode LDnd generates a first light signal. After the first light signal is generated, the light signal is transmitted from the Lu terminal 30 to the light emitting diode LDnu, and the light emitting diode generates a second light signal. The Lu terminal 30 and the light emitting diode LDnu are surrounded by a dashed line, which means that the Lu terminal 30 and the light emitting diode LDnu may be omitted in this embodiment. An embodiment in which the light emitting diode LDnu is omitted will be described below.

As shown in FIG. 7, the CPU 18 executes the program based on an independent internal clock signal to perform data communication with the RAM 19 and the ROM 20 through an appropriate system bus. The CPU 18 is connected to the I/O bus 21. The MCU 15 starts and is initialized by the initializing program stored in the ROM 20. The system is operated by a program PRG2L stored in the ROM 20. In addition, the MCU 15 has a data area in the RAM 19, receives the signal CK or the signal TDn from the Tin terminal 27 through the I/O bus 21, and transmits the signal to the outside through the Tout terminal 24, the Lu terminal 30, and the Ld terminal 32. The CPU 18 monitors the CK terminal 22, checks that the signal TDn is received from the Tin terminal 27 at the light emission timing of the station, transmits the signal from the Ld terminal 32 to the light emitting diode LDnd to generate the first light signal, and transmits the signal from the Lu terminal 30 to the light emitting diode LDnu to generate the second light signal. The Lu terminal 30 and the light emitting diode LDnu are represented by a dashed line, which means that the Lu terminal 30 and the light emitting diode LDnu may be omitted in this embodiment.

Figure 8:
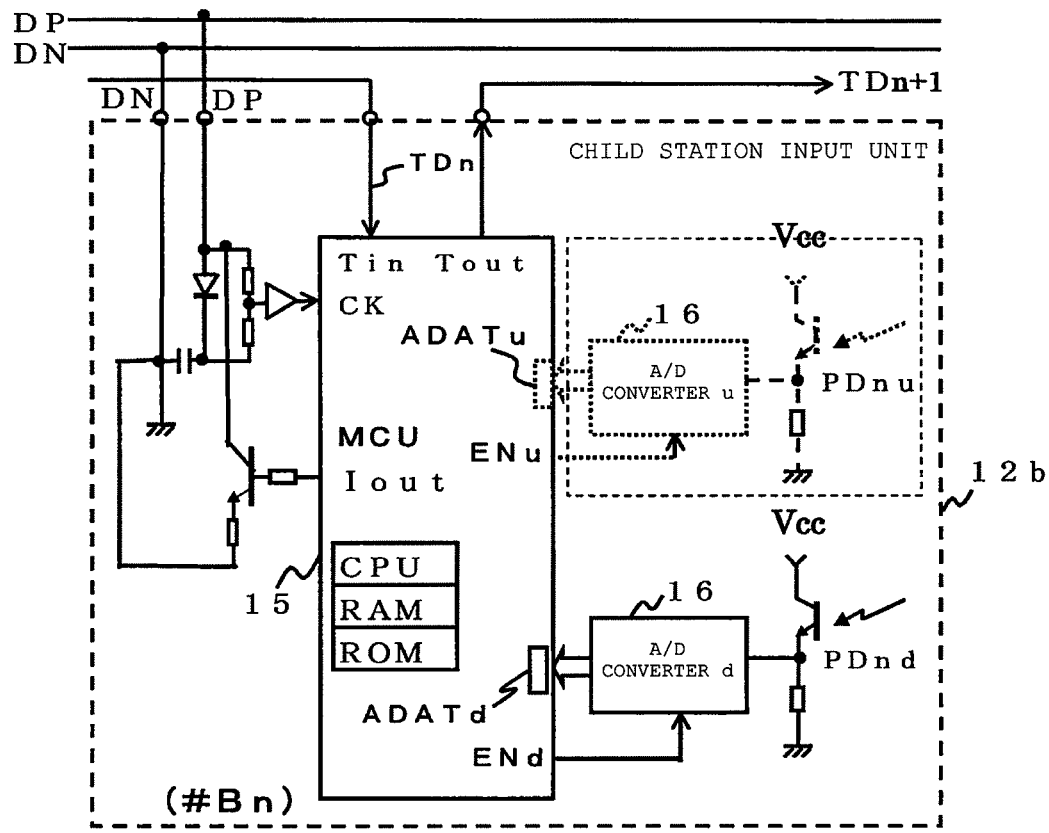
FIG. 8 is a system diagram illustrating a child station input unit of the photoelectric sensor system.
Figure 9:
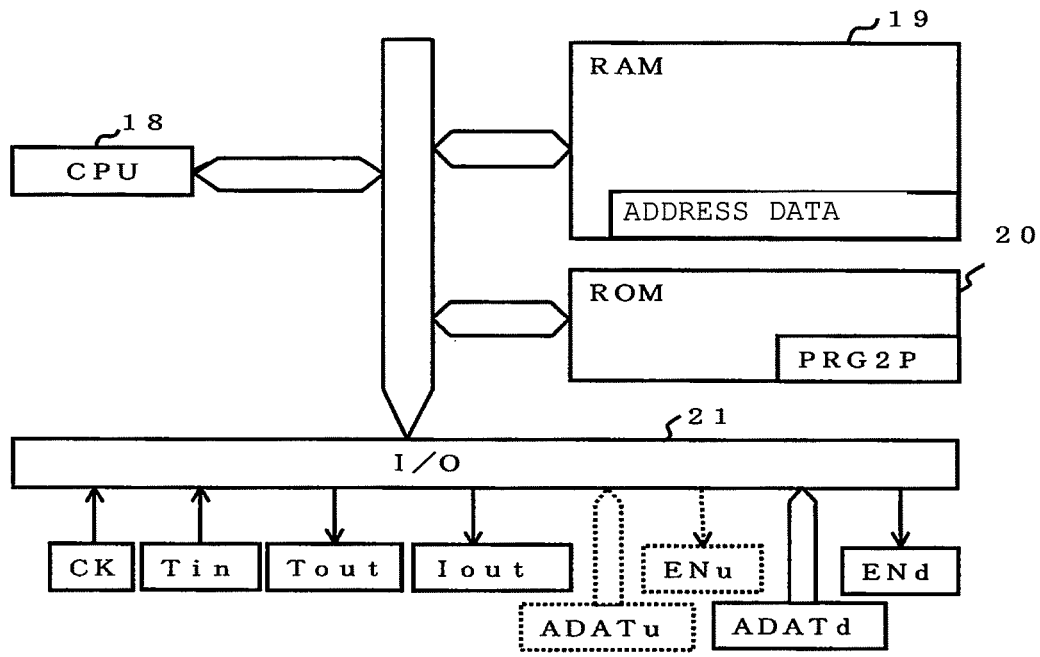
FIG. 9 is a system block diagram illustrating the child station input unit of the photoelectric sensor system.

FIG. 8 is a diagram illustrating the system structure of the child station input unit, and FIG. 9 is a system block diagram illustrating the child station input unit and schematically shows a signal bus connecting circuit elements of the child station input unit. Similar to FIGS. 6 and 7, components having the same functions as those of the manager station are denoted by the same reference numerals.

As shown in FIG. 8, the child station input unit 12b is connected to the DP signal line 7 and the DN signal line 8 through the DP/DN connection terminals. Similar to the manager station 10 or the child station output unit 12a, the child station input unit 12b generates power for the station from the transmission signal on which the power supply voltage is superimposed. The child station input unit 12b receives the signal CK, which is the transmission clock signal of the sensor system, as an input signal of the MCU 15, receives the signal TDn from the Tin terminal 27, performs an input process at the reception timing, and transmits the signal TDn+1 from the Tout terminal 24. In addition, the child station input unit 12b converts the light signals (analog signals) received by the photo diodes PDnu and PDnd, which are light receiving elements, into digital signals using an A/D converter 16 and stores the digital signals as data of an input signal ADATu and data of an input signal ADATd in the RAM 19. The CPU 18 calculates the difference between the data of the signal ADATu and the data of the signal ADATd stored in the RAM 19 and stores the result of determining whether there is the object 35 in the storage area of the RAM 19. For example, in FIG. 3, the sensor units 11*a* and 11*b* detect that there is the object 35. In FIG. 8, the photo diode PDnu, which is a light receiving element, and the A/D converter 16 are represented by a dashed line, which means that the photo diode PDnu and the A/D converter u 16 may be omitted in this embodiment.

The MCU 15 transmits a signal ENu and a signal ENd as effective operation signals of the input signal ADATu and the input signal ADATd to an A/D converter u and an A/D converter d and acquires signals from the A/D converter u and the A/D converter d. In addition, the MCU 15 outputs a cascade signal (signal TDn+1) as the cascade signal (signal TDn) to the child station input unit 12*b* in the next stage when the falling edge of the signal CK is counted twice from the address timing of the station. When the light signal received by the light receiving element PDnd is emitted from the light emitting element LDnd, the received light signal is the reference signal, and the light signal received by the light receiving element PDnu is a detection signal for detecting whether there is an object.

The operation of the child station input unit 12*b* is determined by the program PRG2P stored in the ROM 20 shown in FIG. 9 and is initialized at the same time as power is turned on. The child station input unit 12*b* is operated according to the flow of a program flowchart, which will be described below, and performs determination for detecting the object 35 or determination for detecting abnormality using a signal operation, which will be described below. The MCU 15 includes the CPU 18, the RAM 19 and the ROM 20 that perform data communication with the CPU 18 through an internal bus, and the I/O bus 21. The CPU 18 has an independent clock generating circuit and is operated by the program PRG2P stored in the ROM 20 at the same time as power is turned on. The main function of the program PRG2P is to receive the signal CK as an input signal, to receive the signal TDn from the Tin terminal 27, to receive the signal ADATu and the signal ADATd, to perform determination when each signal is received, to transmit an output signal from the Tout terminal 24, to transmit the signal ENu and the signal ENd to the A/D converter 16, and to transmit the output signal from the Iout terminal 31.

Figure 10:
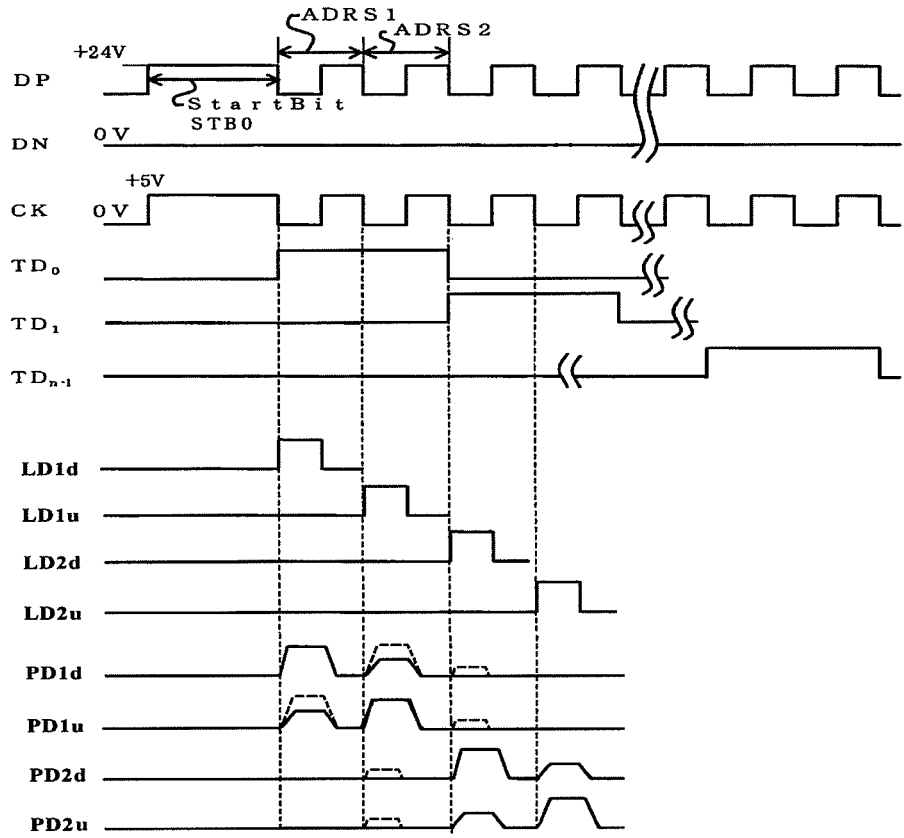
FIG. 10 is a timing chart illustrating transmission signals of the photoelectric sensor system.

The reception timing of the above-mentioned signals will be described with reference to FIG. 10. FIG. 10 is a timing chart illustrating transmission signals.

In FIG. 10, the uppermost side shows the transmission signals on the DP signal line 7 and the DN signal line 8 on which power is superimposed. In a start portion of the transmission signal, a cycle is operated using a signal STB0, which is a start bit with a period longer than a general sensor system clock cycle, as a starting point. That is, when the data length of the address after the start bit is 1 bit, as shown in FIG. 10, the first one bit is an address 1 (ADRS1), and the second one bit is an address 2 (ADRS2). The number of bits between the start bits corresponds to the number of child station input units or child station output units. In the address data when the data length of the address has a width, data is separated for each address width. Here, the case in which the data length of the address is 1 bit will be described. The signal CK in the second raw is a transmission clock signal and has a wave height value of 0 V to 5 V. The signal TD0 is transmitted from the manager station 10 after the start bit.

As shown in FIG. 10, when the data length of the address is 1 bit, the signal TD1 to the signal TDn−1 each having a data length of 2 bits are arranged as the cascade signals after the signal TD0. The signal LD1*d* falls in synchronization with the falling edge of the Signal CK and becomes a half-clock light signal. In the subsequent transmission clock cycle, the signal LD1*u* rises and becomes a half-clock light signal. In the subsequent transmission clock cycle, the signal LD2*d* rises and becomes a half-clock light signal. Similarly, the signals up to the signal LDnu rise. The signal LDnu also becomes a half-clock light signal. When the emitted light signal is reflected from or passes through an object, the light receiving element receives the light signal and generates a signal PD1*d*, a signal PD1*u*, a signal PD2*d*, and a signal PD2*u*. Similarly, the signals up to the received light signal PDnu are generated. The received light signal PD1*d* is generated by receiving the light signal LD1*d* or LD1*u*, and the subsequent signal PD1*u* is also generated by receiving the light signal LD1*d* or the light signal LD1*u*. The signals PD1*d* and PD1*u* include signals generated when the emitted light signal intersecting the object is received. Similar to the signal PD1*d*, the received light signal PD2*d* is generated by receiving the signal LD2*d* or LD2*u*. The signals PD2*d* and PD2*u* also include signals generated when the emitted light signal intersecting the object is received. The signals up to the received light signal PDn are generated by receiving the light signal LDnd or LDnu, and the level data of each of the received light signals is stored in the storage area. In the signals PD1*d* to PD2*u* shown in FIG. 10, a portion with a small wave height value indicates that the light signal is attenuated by the object.

Figure 11:
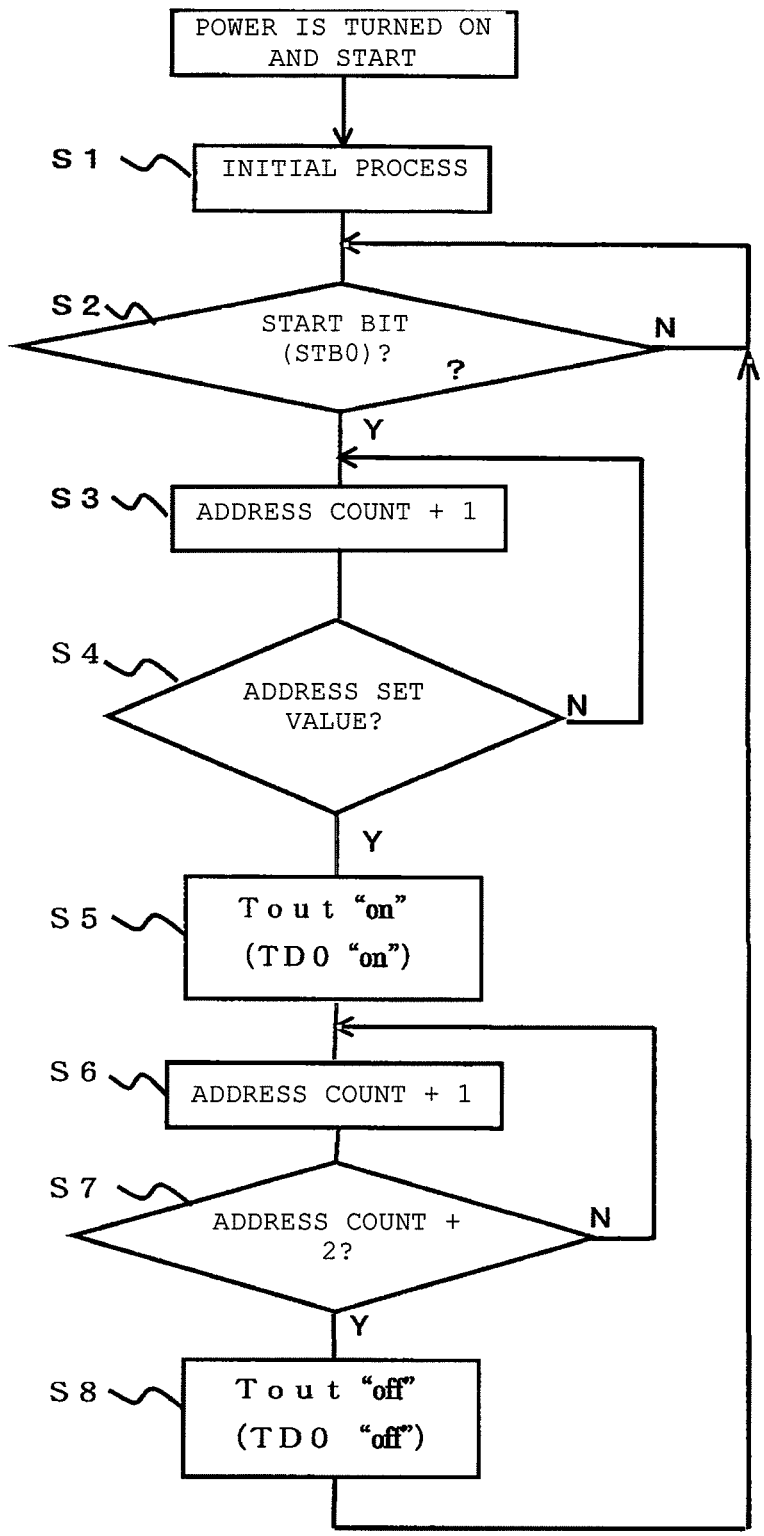
FIG. 11 is a flowchart illustrating a program of the manager station of the photoelectric sensor system.

Next, the signal reception process of the manager station and a detailed operation related to the output of signals will be described according to the flow of the program PRG1. FIG. 11 is a flowchart illustrating the program PRG1 of the manager station.

The program PRG1 starts at the rising edge of the power supply voltage and performs an initial process S1. Then, it is determined whether the signal CK, which is a transmission clock, is a start bit (S2). Then, 1 is added to the address counter at the falling edge of the clock signal CK (S3), and it is determined whether there is the address set value of the manager station (S4). If it is determined that the value of the address counter is not equal to the address set value of the manager station, the address counter is increased at the falling edge of the clock signal CK until the value of the address counter is equal to the address set value of the management station (S3 and S4). If it is determined that the value of the address counter is equal to the address set value of the manager station, a signal Tout (a signal output from the Tout terminal 24; in some cases, the term 'signal' is represented in the same manner) is turned "on" (S5), and 1 is added to the address counter at the falling edge of the next clock signal CK (S6). Then, it is determined whether is added to the address set value (S7). If it is determined that 2 is not added to the address set value, the process returns to Step S6. If it is determined that 2 is added to the address set value, a signal output Tout is turned "off" (S8), and the process returns to Step S2. As such, the program in the manager station is executed according to the flowchart.

Figure 12:
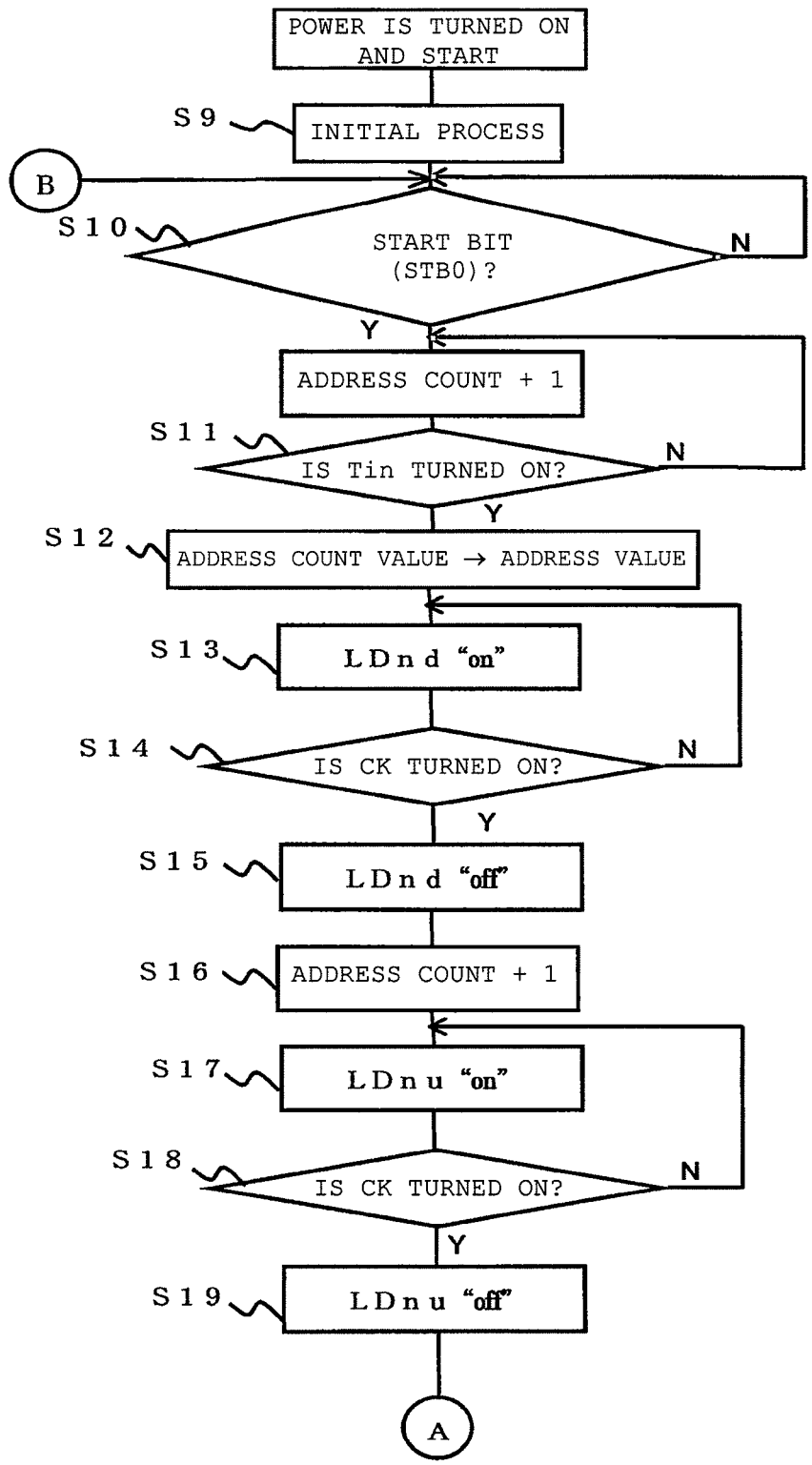
FIG. 12 is a flowchart illustrating a program of the child station output unit of the photoelectric sensor system.
Figure 13:
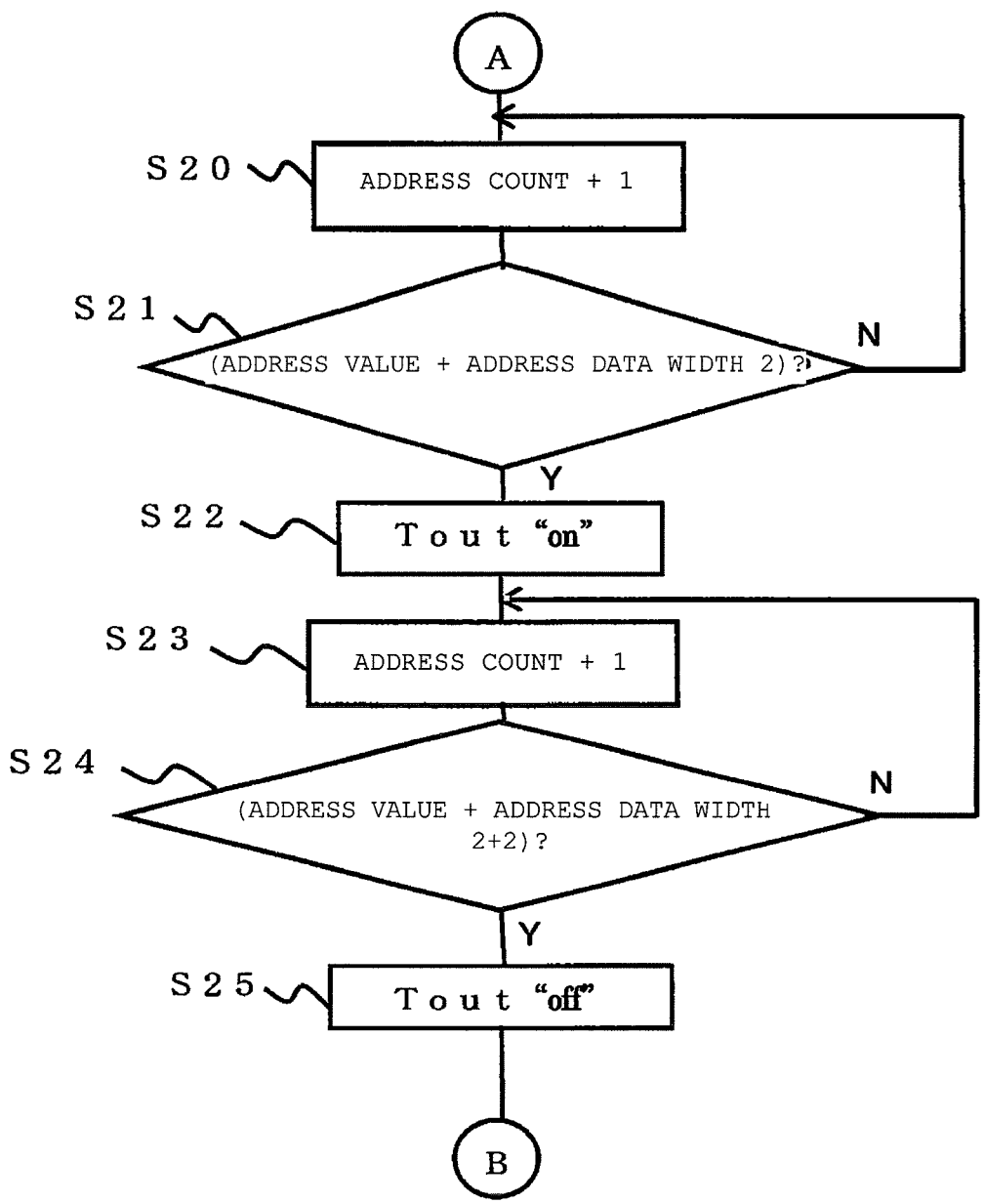
FIG. 13 is a flowchart illustrating the program of the child station output unit of the photoelectric sensor system subsequent to FIG. 12.
Figure 14:
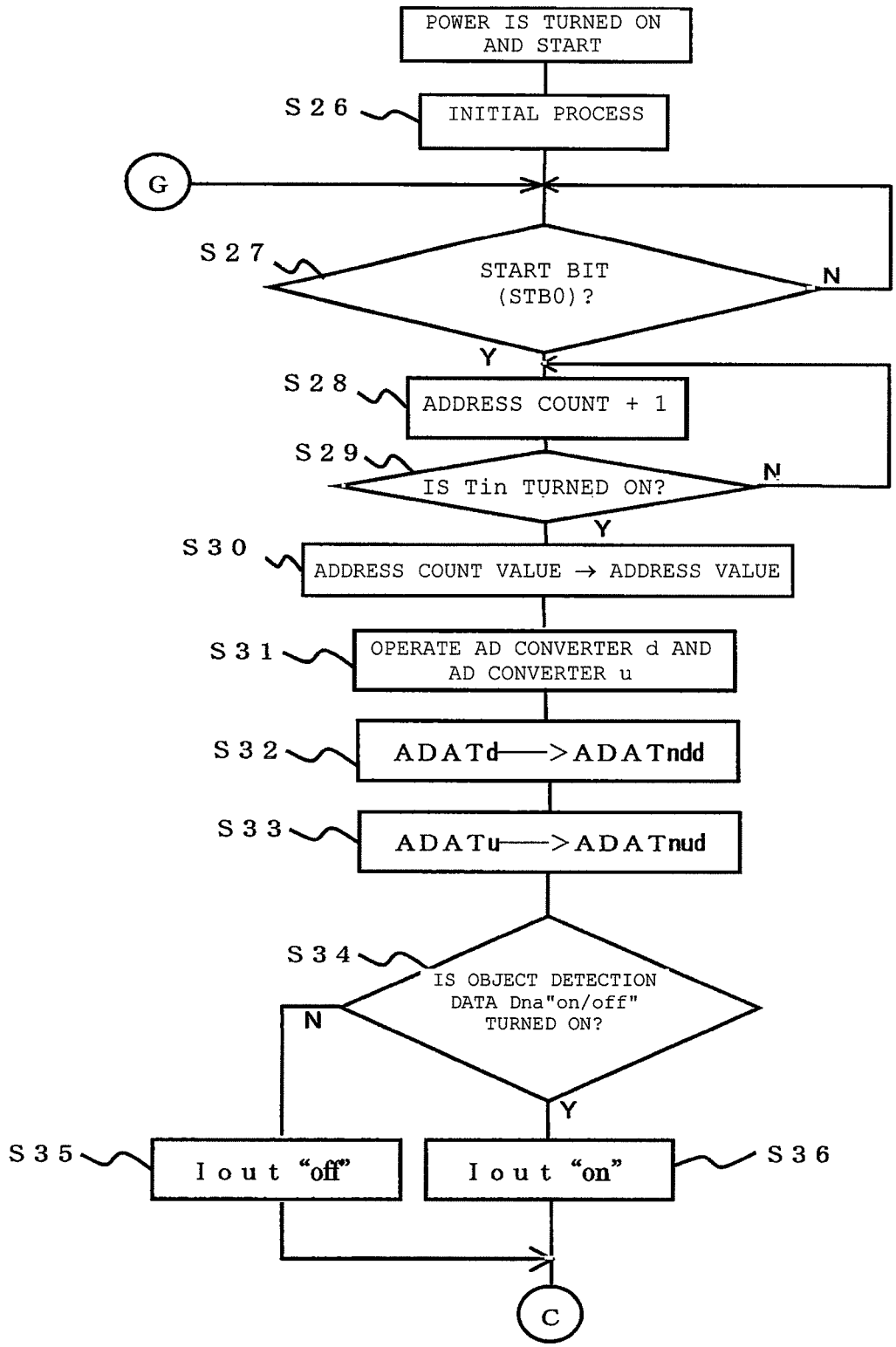
FIG. 14 is a flowchart illustrating a program of the child station input unit of the photoelectric sensor system.

Next, the signal reception process of the child station output unit and a detailed operation related to the output of signals will be described according to the flow of a program PRG2L. FIGS. 12 and 13 are flowcharts illustrating the program PRG2L of the child station output unit.

The program PRG2L starts at the rising edge of the power supply voltage and performs an initial process S9. Then, it is determined whether the signal CK (in some cases, referred to as CK in the following description), which is a transmission clock, is a start bit (S10). Then, 1 is added to the address counter at the falling edge of the clock signal CK, and it is determined whether a signal Tin is turned "on" (S11). If it is determined that the signal Tin is not turned "on", 1 is added to the address counter again at the falling edge of the next clock signal CK, and it is repeatedly determined whether the signal Tin is turned "on" (S12). If it is determined that the signal Tin is turned "on", the address counter value is set to an address value (S11). Then, the light emitting element LDnd is turned "on" (S13). It is determined whether CK is turned "on" (S14). If it is determined that CK is not turned "on", the process returns to Step S13. If it is determined that CK is turned "on", the light emitting element LDnd is turned "off" (S15). Then, 1 is added to the address count at the falling edge of the clock signal CK (S16). Then, the light emitting element LDnu is turned "on" (S17). It is determined whether CK is turned "on" (S18). If it is determined that CK is not turned "on", the process returns to Step S17. If it is determined that CK is turned "on", the light emitting element LDnu is turned "off" (S19).

Then, 1 is added to the address count at the falling edge of the clock signal CK (S20). Then, it is determined whether the address count is (an address value+an address data width 2) (S21). If it is determined that the address count is (an address value+an address data width 2), the signal Tout is turned "on" (S22). If it is determined that the address count is not (an address value+an address data width 2), the process returns to Step S20. Then, 1 is added to the address count again at the falling edge of the clock signal CK (S23). It is determined that the address count is (an address value+an address data width 2+2) (S24). If it is determined that the address count is not (an address value+an address data width 2+2), the process returns to Step S23 and waits for the next clock signal CK. If it is determined that the address count is (an address value+an address data width 2+2), the signal Tout is turned "off" (S25). Then, the process returns to Step S10.

Next, the signal reception process of the child station input unit and a detailed operation related to the output of signals will be described according to the flow of a program PRG2P. FIGS. 14 to 18 are flowcharts illustrating the program PRG2P of the child station input unit.

The program PRG2P starts when the system power is turned on. Then, an initial process is performed (S26). It is determined whether the signal CK is a start bit (STB0) (S27). If it is determined that the signal CK is a start bit (STB0), 1 is added to the address count value at the falling edge of the next clock signal CK (S28). If it is determined that the signal CK is not a start bit (STB0), the process returns to Step S27. Then, it is determined whether the signal Tin is turned "on" (S29). If it is determined that the signal Tin is not turned "on", the process proceeds to Step S28 and waits for the next clock signal CK. If it is determined that the signal Tin is turned "on", the address count value is stored at an address value memory address (S30). Then, the AD converter d and the AD converter u are operated (S31).

Then, the signal ADATd, which is data of the AD converter d, is stored as a signal ADATndd (S32).

In addition, the signal ADATu, which is data of the AD converter u, is stored as a signal ADATnud (S33).

Then, it is determined whether object detection data Dna"on/off" is turned "on" (S34). If it is determined that the object detection data Dna"on/off" is not turned "on", a signal Iout is turned "off" (S35). On the other hand, if it is determined that the object detection data Dna"on/off" is turned "on", the signal Iout is turned "on" (S36). That is, at the address in Step S30, the information of the object detection data Dna"on/off" is transmitted from the child station input unit 12b to the parent station 6.

Figure 15:
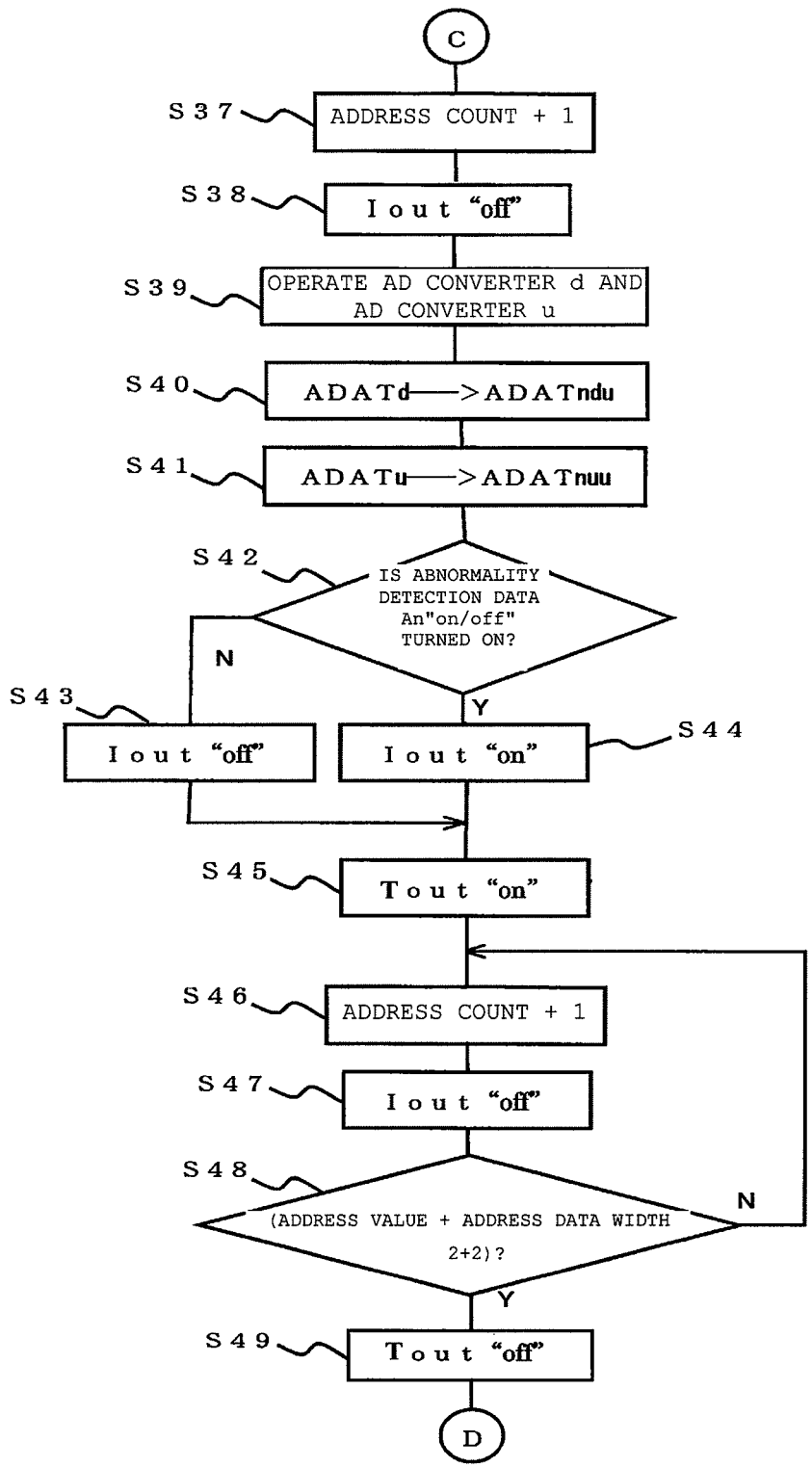
FIG. 15 is a flowchart illustrating the program of the child station input unit of the photoelectric sensor system subsequent to FIG. 14.

Then, as shown in FIG. 15, 1 is added to the address count value at the falling edge of the next clock signal CK (S37). The signal Iout is turned "off" (S38). Then, the AD converter d and the AD converter u are operated (S39), and the signal ADATd, which is data of the AD converter d is stored as a signal ADATndu (S40). In addition, the signal ADATu, which is data of the AD converter u, is stored as a signal ADATnuu (S41). Then, it is determined whether abnormality detection data An"on/off" is turned "on" (S42). If it is determined that the abnormality detection data An"on/off" is not turned "on", the signal Iout is turned "off" (S43).

If it is determined that the abnormality detection data An"on/off" is turned "on", the signal Iout is turned "on" (S44). Then, the signal Tout is turned "on" (S45). Then, 1 is added to the address count value at the falling edge of the next clock signal CK (S46), and the signal Iout is turned "off" (S47). Then, it is determined whether the address count is (the address value+the address data width 2+2) (S48). If it is determined that the address count is not (the address value+the address data width 2+2), the process returns to Step S46. If it is determined that the address count is (the address value+the address data width 2+2), the signal Tout is turned "off" (S49). That is, at the address in Step S37, the information of the abnormality detection data An"on/off" is transmitted from the child station input unit 12b to the parent station 6.

Figure 16:
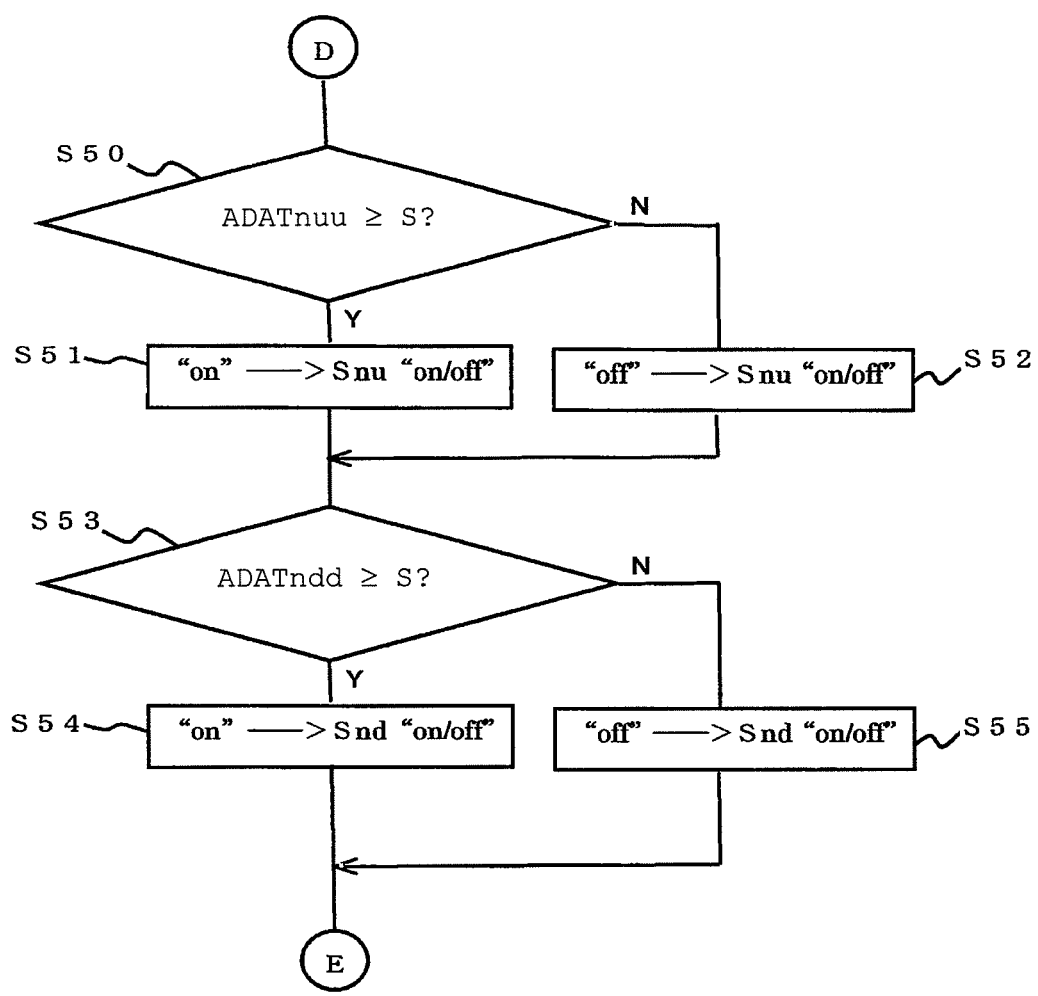
FIG. 16 is a flowchart illustrating the program of the child station input unit of the photoelectric sensor system subsequent to FIG. 15.

Then, as shown in FIG. 16, it is determined whether ADATnuu≥S is satisfied (S50). Here, S indicates threshold value data for determining whether ADATnuu, which is the reference signal that is not shielded by the object, is equal to or more than a predetermined value.

If it is determined that ADATnuu≥S is satisfied, a straight logical determination value Snu"on/off" (a logical signal obtained by the comparison between the reference signal of the second set and S) is turned "on" (S51). If it is determined that ADATnuu≥S is not satisfied, the straight logical determination value Snu"on/off" is turned "off" (S52). Then, it is determined whether ADATndd≥S is satisfied (S53). Here, S indicates threshold value data for determining whether ADATndd, which is the reference signal that is not shielded by the object, is equal to or more than a predetermined value.

If it is determined that ADATndd≥S is satisfied, a straight logical determination value Snd"on/off" (a logical signal obtained by the comparison between the reference signal of the first set and S) is turned "on" (S54). If it is determined that ADATndd≥S is not satisfied, the straight logical determination value Snd"on/off" is turned "off" (S55).

Figure 17:
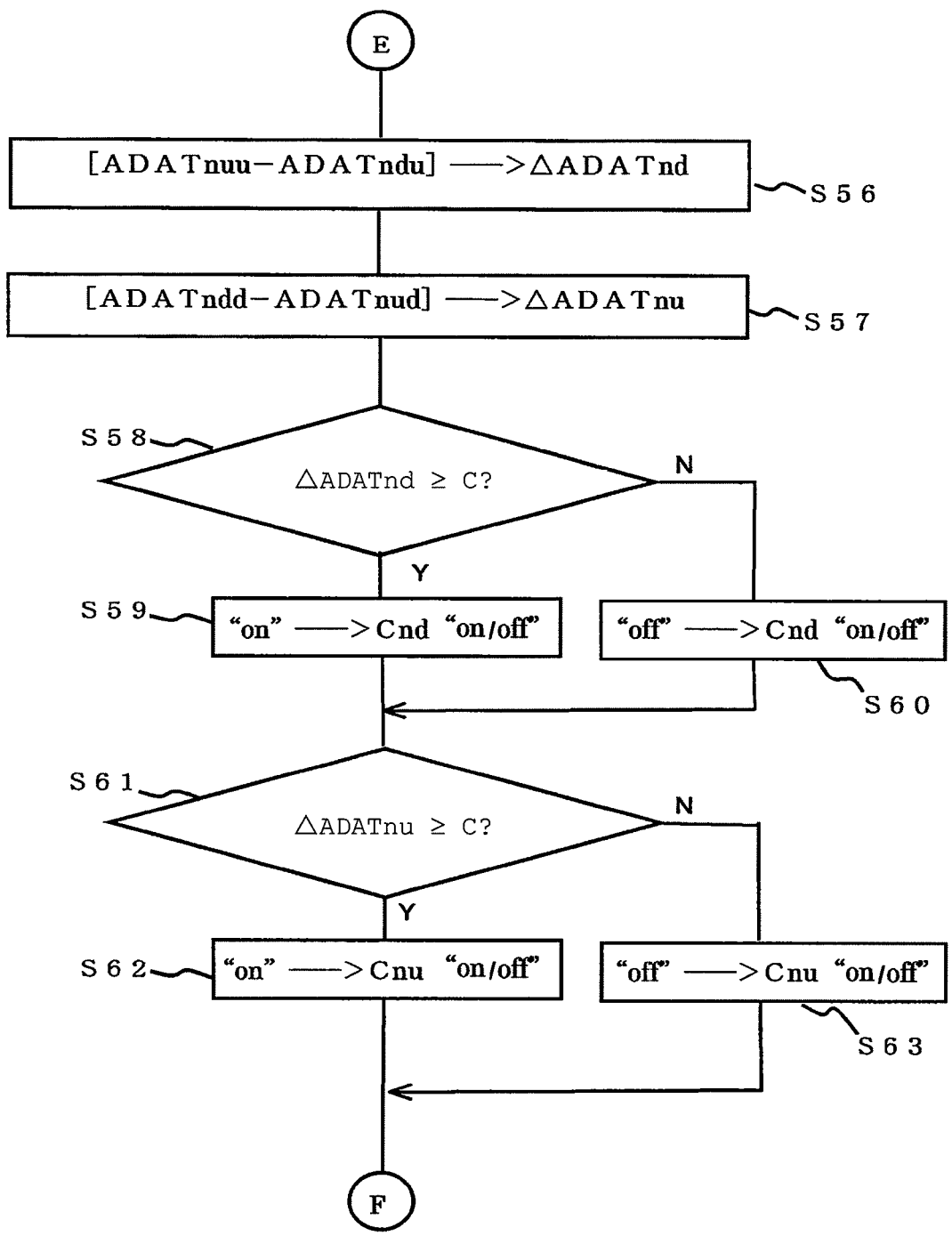
FIG. 17 is a flowchart illustrating the program of the child station input unit of the photoelectric sensor system subsequent to FIG. 16.

Then, as shown in FIG. 17, the calculation result of [ADATnuu−ADATndu] is stored as ΔADATnd (S56).

In addition, the calculation result of [ADATndd−ADATnud] is stored as ΔADATnu (S57).

Then, it is determined whether ΔADATnd≥C is satisfied (S58). Here, C indicates threshold value data for determining whether the difference between the level of ADATnuu, which is the reference signal, and the level of ADATndu, which is the detection signal, is equal to or more than a predetermined value.

If it is determined that ΔADATnd≥C is satisfied, a cross logical determination value Cnd"on/off" (a logical signal obtained by the comparison between C and the difference between the level of the reference signal of the second set and the level of the detection signal) is turned "on" (S59). If it is determined that ΔADATnd≥C is not satisfied, the cross logical determination value Cnd"on/off" is turned "off" (S60). Similarly, it is determined whether ΔADATnu≥C is satisfied (S61). Here, C indicates threshold value data for determining whether the difference between the level of ADATndd, which is the reference signal, and the level of ADATnud, which is the detection signal, is equal to or more than a predetermined value.

If it is determined that $\Delta$ADATnu$\geq$C is satisfied, a cross logical determination value Cnu"on/off" (a logical signal obtained by the comparison between C and the difference between the level of the reference signal of the first set and the level of the detection signal) is turned "on" (S62). If it is determined that $\Delta$ADATnu$\geq$C is not satisfied, the cross logical determination value Cnu"on/off" is turned "off" (S63).

Figure 18:
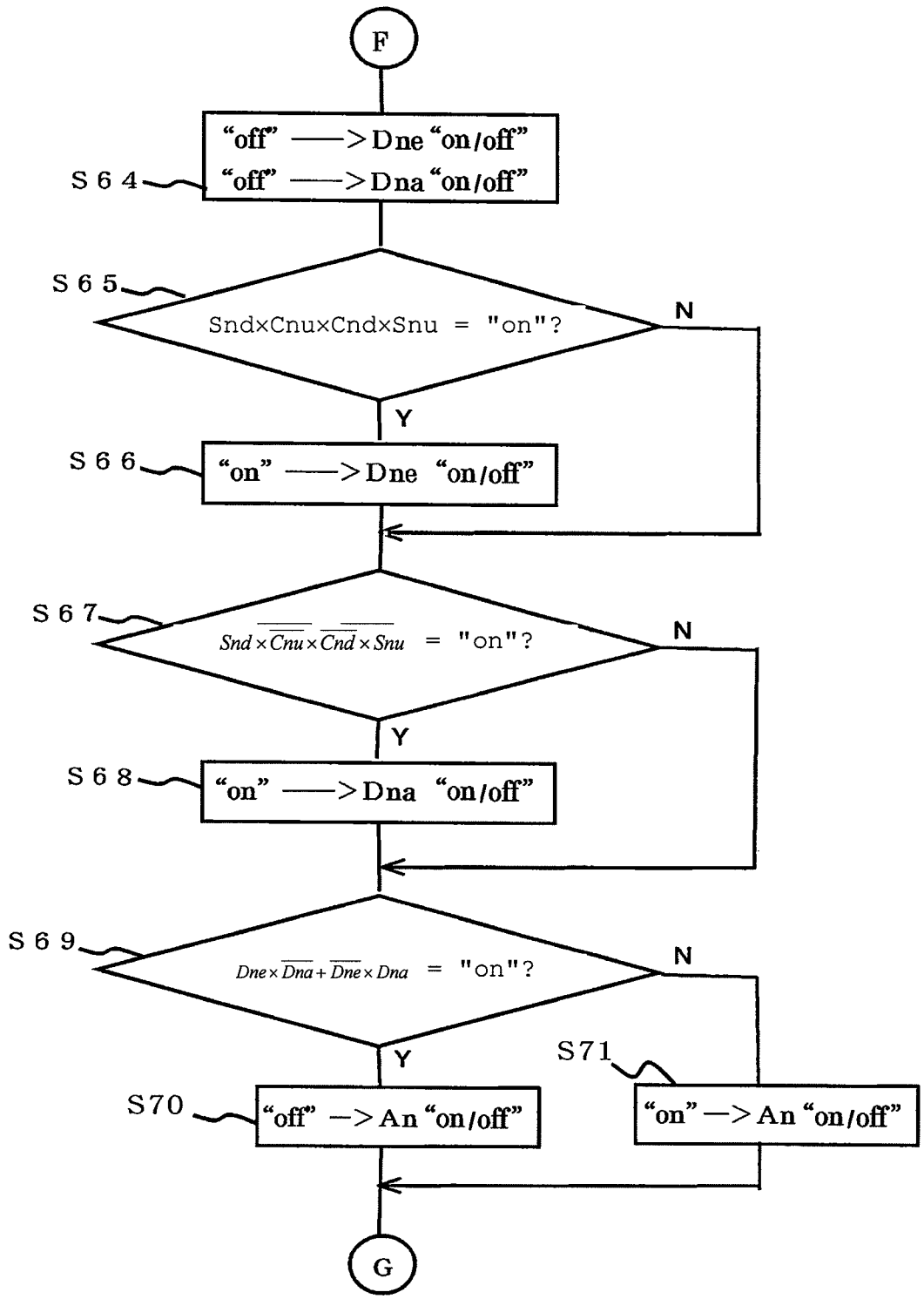
FIG. 18 is a flowchart illustrating the program of the child station input unit of the photoelectric sensor system subsequent to FIG. 17.

Then, as shown in FIG. 18, object detection data Dne"on/off" is turned "off" and object absence detection data Dna"on/off" is turned "off" (S64). Then, it is determined whether the following logical arithmetic expression 1 is satisfied (S65).

$$Snd \times Cnu \times Cnd \times Snu = \text{"on"}. \qquad \text{[Expression 1]}$$

If it is determined that Expression 1 is satisfied ("on"), the object detection data Dne"on/off" is turned "on" (S66). If it is determined that Expression 1 is not satisfied, the process skips to Step S67. It is determined whether the following logical arithmetic expression 2 is satisfied (S67).

$$Snd \times \overline{Cnu} \times \overline{Cnd} \times Snu = \text{"on"} \qquad \text{[Expression 2]}$$

(where $\overline{Cnu}$ indicates the inverse logic of Cnu and $\overline{Cnd}$ indicates the inverse logic of Cnd).

When the logical arithmetic expression 2 is satisfied, the object absence detection data Dna"on/off" is turned "on" (S68). When the logical arithmetic expression 2 is satisfied ("on"), the process skips to Step S69. Then, it is determined whether the following logical arithmetic expression 3 is satisfied (S69).

$$Dne \times \overline{Dna} + \overline{Dne} \times Dna = \text{"on"} \qquad \text{[Expression 3]}$$

(where $\overline{Dna}$ indicates the inverse logic of Dna and $\overline{Dne}$ indicates the inverse logic of Dne).

When the logical arithmetic expression 3 is satisfied, the abnormality detection data An"on/off" is turned "off" (S70), and the process returns to Step S27. When the logical arithmetic expression 3 is not satisfied, the abnormality detection data An"on/off" is turned "on" (S71), and the process returns to Step S27.

An arithmetic process of determining whether there is an object is from Step S50 to Step S71, and the logical determination thereof will be described briefly with reference to FIG. 19. When the straight logical determination value Snu"on/off" is turned "on", the straight logical determination value Snd"on/off" is turned "on", the cross logical determination value Cnu"on/off" is turned "on", and the cross logical determination value Cnd"on/off" is turned "on", it is possible to determine that an object is detected. When the straight logical determination value Snu"on/off" is turned "on", the straight logical determination value Snd"on/off" is turned "on", the cross logical determination value Cnu"on/off" is turned "off", and the cross logical determination value Cnd"on/off" is turned "off", it is possible to determine that no object is detected. When logical determination values other than the above are obtained, it is determined that an abnormal state is detected.

The arithmetic process will be described using the (n-th) child station input unit 12b with the address #Bn as an example. In the following description, $\Delta$ (triangle) indicates differential data.

It is assumed that the calculation result of the difference between an n-th reference signal and an n-th detection signal is $\Delta$ADATnd. When the n-th reference signal of the second set is ADATnuu and the n-th detection signal of the second set is ADATndu, the calculation result of $\Delta$ADATnd=ADATnuu−ADATndu is stored.

When the n-th reference signal of the first set is ADATndd and the n-th detection signal of the first set is ADATnud, the calculation result of $\Delta$ADATndu=ADATndd−ADATnud is stored.

When the n-th reference signal ADATnuu of the second set is greater than the threshold value data S for determining whether the reference signal ADATnuu is equal to or more than a predetermined value, the straight logical determination data Snu"on/off" is turned "on", and it is determined that the n-th reference signal of the second set is normally operated.

When the n-th reference signal ADATnuu of the second set is smaller than the threshold value data S for determining whether the reference signal ADATnuu is equal to or more than a predetermined value, the straight logical determination data Snu"on/off" is turned "off", and it is determined that the n-th reference signal of the second set is not normally operated.

When the n-th reference signal ADATndd of the first set is greater than the threshold value data S for determining whether the reference signal ADATndd is equal to or more than a predetermined value, the straight logical determination data Snd"on/off" is turned "on" and it is determined that the n-th reference signal of the first set is normally operated.

When the n-th reference signal ADATndd of the first set is smaller than the threshold value data S for determining whether the reference signal ADATndd is equal to or more than a predetermined value, the straight logical determination data Snd"on/off" is turned "off", and it is determined that the n-th reference signal of the first set is not normally operated.

When $\Delta$ADATnd is greater than the threshold value data C for determining whether $\Delta$ADATnd is equal to or more than a predetermined value, the cross logical determination data Cnd"on/off" is turned "on", which means that there is an object in the second set.

When $\Delta$ADATnd is smaller than the threshold value data C for determining whether $\Delta$ADATnd is equal to or more than a predetermined value, the cross logical determination data Cnd"on/off" is turned "off", which means that there is no object in the second set.

When $\Delta$ADATnu is greater than the threshold value data C for determining whether $\Delta$ADATnu is equal to or more than a predetermined value, the cross logical determination data Cnu"on/off" is turned "on", which means that there is an object in the first set.

When $\Delta$ADATnu is smaller than the threshold value data C for determining whether $\Delta$ADATnu is equal to or more than a predetermined value, the cross logical determination data Cnu"on/off" is turned "off", which means that there is no object in the first set.

When the logical product of the following Expression 4 is "on", the object detection data Dne"on/off" is turned "on". This means that an object certainly exists.

$$Snd \times Cnu \times Cnd \times Snu. \qquad \text{[Expression 4]}$$

When the logical product of the following Expression 4 is "off", the object detection data Dne"on/off" is maintained in an "off" state. This means that an object certainly does not exist. The "on" or "off" state of the object detection data Dne"on/off" is stored.

When the logical product of the following Expression 5 is "on", the object absence detection data Dna"on/off" is turned "on". This means that an object certainly does not exist.

$$Snd \times \overline{Cnu} \times \overline{Cnd} \times Snu \qquad \text{[Expression 5]}$$

(where $\overline{Cnu}$ indicates the inverse logic of Cnu and $\overline{Cnd}$ indicates the inverse logic of Cnd).

When the logical product of Expression 5 is "off", the object absence detection data Dna"on/off" is maintained in an "off" state. This means that there is an object.

The "on" or "off" of the object absence detection data Dna"on/off" is stored. That is, an exclusive relationship is established between the logic of the object detection data Dne"on/off" indicating that an object certainly exists and the logic of the object absence detection data Dna"on/off" indicating that an object certainly does not exist.

When the exclusive OR of the following Expression 6 is "on", the abnormality detection data An"on/off" is turned "off".

$$Dne \times \overline{Dna} + \overline{Dne} \times Dna \qquad \text{[Expression 6]}$$

(where $\overline{Dna}$ indicates the inverse logic of Dna and $\overline{Dne}$ indicates the inverse logic of Dne).

When the exclusive OR of Expression 6 is not "on", the abnormality detection data An"on/off" is turned "on". That is, when the exclusive relationship is not established between the logic of the object detection data Dne"on/off" and the logic of the object absence detection data Dna"on/off", the abnormality detection data An"on/off" is turned "on". When the abnormality detection data An"on/off" is turned "on", the light emitting unit 36 and the light receiving unit 37 are out of order, or the object is abnormally held.

FIG. 20 is a diagram illustrating the memory map of the RAM, which is a storage area of the child station input unit with the address #Bn. In the map, data is arranged such that data of channel 1 is arranged on the lowermost side and data of channel n is arranged on the uppermost side. In addition, data items are arranged in the order of the signal data (data after A/D conversion) of a photodiode (light receiving element), cross differential data, straight logical determination data, cross logical determination data, object detection data, and abnormality detection data from the left side. The CPU 18 frequently stores the data at predetermined memory addresses of the RAM 19.

FIG. 21 is a diagram illustrating the name of each operation data of the child station input unit with the address #Bn. In the map, similar to FIG. 20, data is arranged such that data of the channel 1 is arranged on the lowermost side and data of the channel n is arranged on the uppermost side. Data items are arranged in the order of the sequential light emission state of the light emitting unit LD, the signal data of the photodiode (light receiving element), the cross differential data, the straight logical determination data, the cross logical determination data, the object detection data, and the abnormality detection data from the left side. The CPU 18 frequently stores the data at predetermined memory addresses of the RAM 19.

In the photoelectric sensor system, as described above, a pair of the light emitting element LDnd and the first light receiving element PDnd and a pair of the light emitting element LDnd and the second light receiving element PDnu form the first set, and a pair of the second light emitting element LDnu and the first light receiving element PDnd and a pair of the second light emitting element LDnu and the second light receiving element PDnu form the second set. Information obtained from the first set and the information obtained from the second set are checked so as to detect information indicating whether there is the object. However, when double check and detection are not needed due to a good balance with required accuracy, only the first set or the second set may be used to detect an object. In this case, the child station output unit may include only one light emitting element.

The child station output unit 12a including the light emitting unit 36 and the child station input unit including the light receiving unit 37 are unitized into the sensor unit 11n used in the photoelectric sensor system, but they may be unitized into the sensor unit, if necessary. However, when the child station output unit and the child station input unit form one unit, the gap between the stages is set to an arbitrary value. Therefore, it is possible to extend the application range.

When it is not detected whether there is the object 35a, the abnormal state of the object 35a or a sensor failure, or both the abnormal state of the object 35a and the sensor failure may be detected. In this case, the logical operation may be performed by each of the child station input units 12b, or it may be performed by the parent station 6 or the control unit 1.

Figure 22:
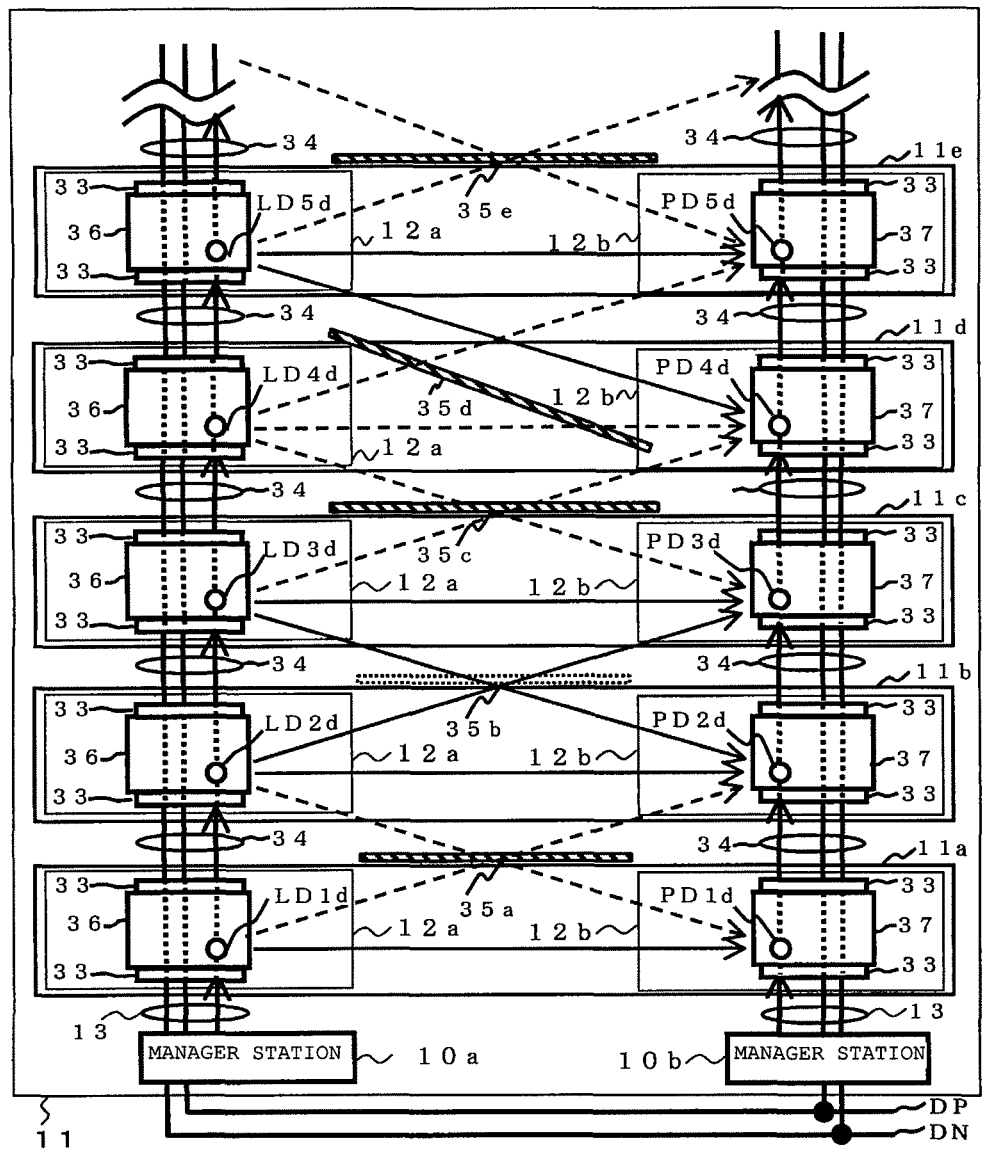
FIG. 22 is a diagram illustrating the structure of a photoelectric sensor of a photoelectric sensor system according to another embodiment of the invention.

In the photoelectric sensor system, the child station input unit 12b includes two light receiving elements PDnu and PDnd. However, as described above, one of the two light receiving elements may be omitted. That is, the child station input unit 12b may include one light receiving element. FIG. 22 is a diagram illustrating the structure of a photoelectric sensor according to another embodiment of the invention. In this embodiment, components that are substantially the same as those according to the embodiment shown in FIGS. 1 to 21 are denoted by the same reference numerals, and a description thereof will be omitted. In addition, a photoelectric sensor system using the photoelectric sensor has substantially the same structure as the photoelectric sensor system shown in FIGS. 1 to 21. Therefore, the system is not shown.

A photoelectric sensor 11 shown in FIG. 22 includes a plurality of sensor units connected to each other, and each of the sensor units includes the child station output unit 12a having one light emitting element LDnd and the child station input unit 12b having one light receiving element PDnd. The number of sensor units is not particularly limited, but a necessary number of sensor units may be connected to each other, if necessary. Although the photoelectric sensor includes a plurality of sensor units connected to each other, only five sensor units 11a, 11b, 11c, 11d, and 11e (hereinafter, the sensor units are generically referred to as a sensor unit 11) are shown in FIG. 22 for convenience of illustration.

The photoelectric sensor 11 is connected to the DP signal line 7 and the DN signal line 8 through a light-emission-side manager station 10a and a light-reception-side manager station 10b and can be controlled by the parent station 6. The light-emission-side manager station 10a and the light-reception-side manager station 10b are connected to the sensor unit 11a through the crossover lines 13, and the sensor units 11a to 11e are cascaded to each other by the child station interconnects 34. Each of the sensor units 11 is connected to the DP signal line 7 and the DN signal line 8, and a detection signal indicating whether there is an object is transmitted from each of the sensor unit 11 to the DP signal line 7 and the DN signal line 8.

In the photoelectric sensor 11, a light signal emitted from the light emitting element LDnd to the light receiving element PDnd of the same sensor unit 11n becomes a received signal that is not shielded by the object 35a, that is, a reference signal. A light signal that is obliquely emitted from the light emitting element LDnd to a light receiving element PD(n+1)d of a sensor unit 11n+1 (in the upper stage) adjacent to the sensor unit 11n including the light emitting element LDnd is shielded by the object 35a and the light signal received by the light receiving element PD(n+1)d is attenuated and becomes a detection signal with a very low level. The level of the reference signal and the level of the detection signal are compared to detect information indicating whether there is the object 35a. The sensor unit adjacent to the sensor unit 11n including the light emitting element LDnd may be a sensor unit 11n−1 (on the first stage side). However, since substantially the same detection operation as described above is performed on the sensor unit 11n−1 and the sensor unit 11n+1, only the case of the sensor unit 11n+1 will be described below.

As such, even though the child station input unit 12b does not include two light receiving elements, it is possible to achieve the same function as that when the child station input unit includes two light receiving elements by using the light receiving element of an adjacent child station input unit 12b.

The manager station 10a and the manager station 10b transmit a cascade signal (in some cases, referred to as a signal TDn) to the child station output unit 12a and the child station input unit 12b connected thereto at the same time, respectively. The child station input unit 12b or the child station output unit 12a receives the address timing of the station transmitted by the signal TDn and outputs a cascade signal (signal TDn+1) to the child station input unit 12b in the next stage. In this case, the cascade signal TDn+1 is output when the falling edge of the signal CK is counted twice at the address of the station. The signal TDn is an address timing signal of the subsequent child station output unit or the subsequent child station input unit, similar to the photoelectric sensor system shown in FIGS. 1 to 21. For example, the light reception timing of the child station input unit 12b of the sensor unit 11b is the light emission timing of the light emitting element LD1d of the sensor unit 11a and the light emission timing of the light emitting element LD2d of the sensor unit 11b. At the light emission timing of the light emitting element LD1d, the light signal received by the light receiving element PD1d is the reference signal, and the light signal received by the light receiving element PD2d is the detection signal. At the light emission timing of the light emitting element LD2d, the light signal received by the light receiving element PD1d is the detection signal and the light signal received by the light receiving element PD2d is the reference signal. That is, the sensor unit 11n receives the light signal at the light emission timing of the light emitting element LD(n−1)d and the light emission timing of the light emitting element LDnd. The received light signal is converted into digital signal data by an A/D converter and the digital signal data is stored in the storage area, similar to the photoelectric sensor system shown in FIGS. 1 to 21.

In the photoelectric sensor 11, it is also possible to check and detect information indicating whether there is the object 35a twice. In this case, a pair of the light emitting element LDn and the light receiving element PDn of the sensor unit 11n and a pair of the light emitting element LDn of the sensor unit 11n and the light receiving element PDn+1 of the sensor unit 11n+1 may form a first set, and a pair of the light emitting element LDn+1 of the sensor unit 11n+1 and the light receiving element PDn of the sensor unit 11n and a pair of the light emitting element LDn+1 and the light receiving element PDn+1 of the sensor unit 11n+1 may form a second set.

Since the basic structure of the child station input unit 12b of the photoelectric sensor 11 is the same as that of the photoelectric sensor system shown in FIGS. 1 to 21, the system structure of the child station input unit shown in FIG. 8 is referred to as the basic structure of the child station input unit 12b.

In the child station input unit 12b, the light receiving element PDnu represented by a dashed line in FIG. 8 is omitted, and the child station input unit 12b includes only the light receiving element PDnd.

An adjacent sensor unit is the sensor unit 11n+1, but when double check and detection are performed, both the sensor unit 11n−1 and the sensor unit 11n+1 are used as the adjacent sensor units.

Next, the operation of the photoelectric sensor 11 will be described with reference to FIG. 22. First, when the manager stations 10a and 10b transmit a timing signal TD0, the A/D converter 16 of each of the sensor units 11a and 11b converts an analog light signal received by each of the light receiving element PD1d of the sensor unit 11a and the light receiving element PD2d of the sensor unit 11b into a digital signal, and the digital signal is stored as the data level of a signal ADAT in the RAM 19. In this case, the light signal received by the light receiving element PD1d is stored as the data level of a signal ADATd in the RAM 19, and the light signal received by the light receiving element PD2d is stored as the data level of a signal ADATu in the RAM 19. Each CPU 18 calculates the difference between the data level of the signal ADATu and the data level of the signal ADATd stored in the RAM 19 and stores the result of detecting whether there is an object 35a in the storage area of the RAM 19. In the example of the photoelectric sensor 11, the object 35a between the sensor unit 11a and the sensor unit 11b is detected.

In FIG. 22, a dashed line indicates that an object 35b which should exist in a normal state does not exist. For the position of the object 35b, the light signal received by the light receiving element PD2d of the sensor unit 11b is converted into a digital signal by the A/D converter 16 and is then stored as the data level of the signal ADATd in the RAM 19. In addition, the light signal received by the light receiving element PD3d of the sensor unit 11c is converted into a digital signal by the A/D converter 16 and is then stored as the data level of the signal ADATu in the RAM 19. The CPU 18 of each of the sensor units 11b and 11c calculates the difference between the data level of the signal ADATd and the data level of the signal ADATu stored in the RAM 19. In the example of the photoelectric sensor, there is no object, and neither of the light signals emitted from the light emitting element LD2d of the sensor unit 11b to the light receiving elements PD2d and PD3d is attenuated. Therefore, the difference is approximately zero, and it is determined that there is no object 35b. The determination result is stored in the storage area of the RAM 19.

The sensor unit 11c and the sensor unit 11d are operated for an object 35c in the same way as the sensor units 11a and 11b are operated for the object 35 and detect the object 35c.

An object 35d is abnormally inclined, and the light signal that is emitted from the light emitting element LD4d to the light receiving element PD4d of the sensor unit 11d without being shielded by the object 35d in a normal state is shielded by the object 35d. The light signal emitted from the light emitting element LD4d to the light receiving element PD5d of the sensor unit 11e is shielded by the object 35d. Since both the reference signal and the detection signal are shielded, it is detected that the object 35d is abnormally disposed or held (inclined).

Figure 23:
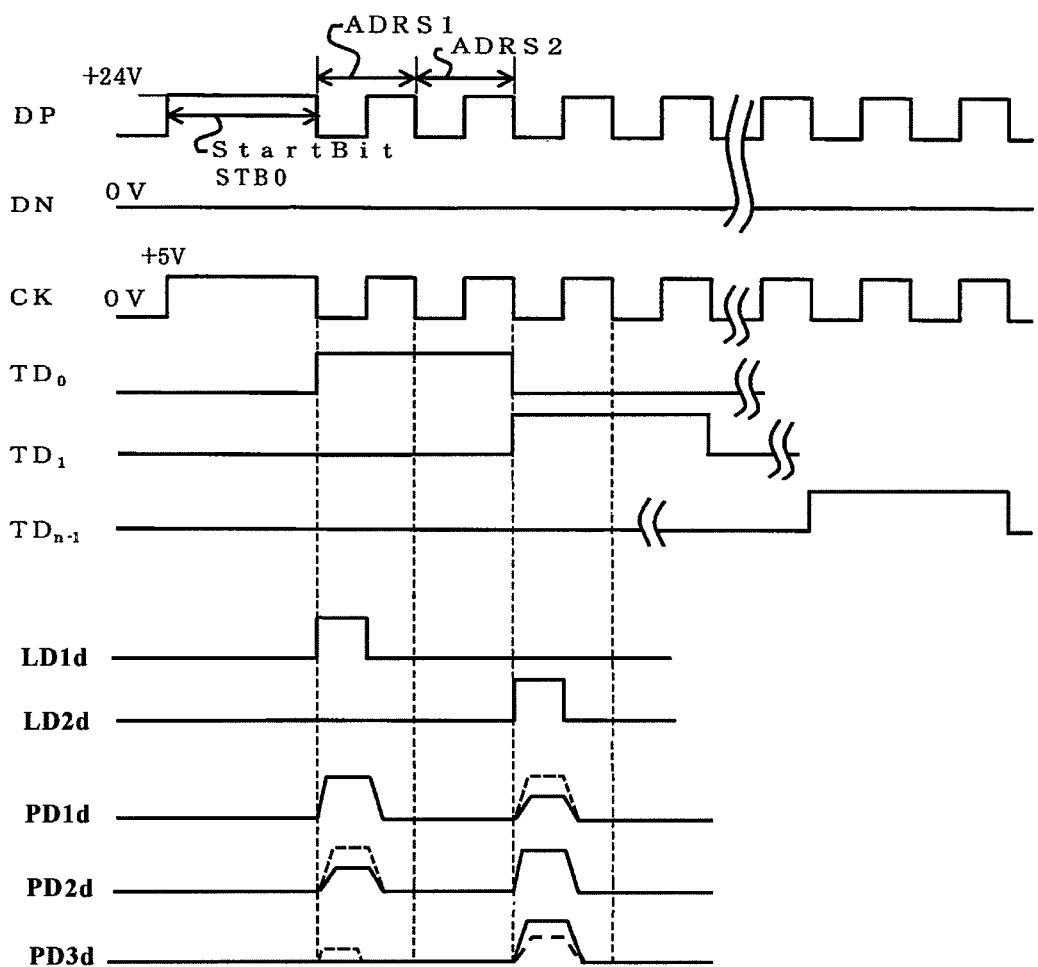
FIG. 23 is a timing chart illustrating the transmission signals of the photoelectric sensor system using the photoelectric sensor.

The signal reception timing of the photoelectric sensor 11 will be described briefly with reference to FIG. 23. FIG. 23 is a timing chart illustrating transmission signals. The timing chart of FIG. 23 is substantially the same as the timing chart of FIG. 10 except for an emitted light signal and a received light signal. Therefore, only the signals PD1$d$, PD2$d$, and PD3$d$, which are the received light signals, will be described below.

The received light signal PD1$d$ is generated by receiving the emitted light signal LD1$d$ or LD2$d$, and the received light signal PD2$d$ is generated by receiving the emitted light signal LD1$dl$, LD2$d$, or LD3$d$ (not shown). The signals PD1$d$ and PD2$d$ include signals generated when the emitted light signal intersecting the object is received. Similar to the signal PD2$d$, the received light signal PD3$d$ is generated by receiving the emitted light signal LD2$d$, LD3$d$ (not shown), or LD4$d$ (not shown). The signal PD3$d$ includes a signal generated when the emitted light signal intersecting the object is received. Similarly, the received light signal PD$n d$ is generated by receiving the emitted light signal LD(n−1)d, LD$n$d, or LD(n+1). The level of each of the received light signals is stored in the storage area. In FIG. 23, a portion of the signal PD3$d$ that has a small wave height value and is represented by a dashed line indicates that there is an object, that is, the emitted light signal is attenuated.

Similar to the sensor unit shown in FIGS. 1 to 21, the child station output unit 12$a$ including the light emitting unit 36 and the child station input unit including the light receiving unit 37 are unitized into the sensor unit 11$n$ of the photoelectric sensor. Therefore, it is possible to arbitrarily set the gap between the stages, and the photoelectric sensor can be applied to detect objects with various thicknesses or sizes. In addition, it is possible to extend the application range. For example, the photoelectric sensor can be applied to detect objects with different shapes.

In the above-described embodiments, two light receiving elements receive the light signal emitted from one light emitting element, and each of the light receiving elements generates the reference signal and the detection signal. However, one light receiving element may receive light signals emitted from two different light emitting elements at the time-division light emission timing of each light emitting element and generate the reference signal and the detection signal at the time-division light emission timing of each light emitting element. This is a second photoelectric sensor according to another embodiment of the invention. The second photoelectric sensor has the following effects in addition to the above-mentioned effects. Even though the light receiving unit includes a single light receiving element, it is possible to obtain the difference between the level of the reference signal and the level of the detection signal without transmitting or receiving signals to or from adjacent light receiving units. Therefore, it is possible to simplify the structure of a circuit or an operation.

EXPLANATION OF NUMERALS OR SYMBOLS

1: control unit
2: output unit
3: input unit
4: control signal
5: supervisory signal
6: parent station
7: DP signal line
8: DN signal line
10: manager station
11: photoelectric sensor
11$a$, ..., 11$n$: sensor unit
12: child station input unit, child station output unit
13: crossover line
14: address setting
15: MCU
16: A/D convertor
17: cascade line
18: CPU
19: RAM
20: ROM
21: I/O bus
22: CK terminal
24: $T_{out}$ terminal
27: $T_{in}$ terminal
30: LU terminal
31: $I_{out}$ terminal
32: Ld terminal
33: connector
34: child station interconnect
35: object
36: light emitting unit
37: light receiving unit

What is claimed is:

1. A photoelectric sensor, comprising:

a light emitting unit and a light receiving unit that are arranged opposite to each other, wherein the photoelectric sensor detects whether there is an object in a space between the light emitting unit and the light receiving unit on the basis of a variation in the intensity of light-signals received by the light receiving unit, the light receiving unit includes first and second light receiving elements and a controller, the first and second light receiving elements are operated in synchronization with a light emission timing signal of the light emitting unit, the controller stores data of the light signals received by the first and second light receiving elements, and the controller converts and calculates a difference between the data of the light signals received by the first and second light receiving elements, the light emitting unit includes:

a first light emitting element that is arranged such that light signals are emitted to the first light receiving element without intersecting the object and to the second light receiving element through the object; and a second light emitting element that is arranged such that light signals are emitted to the second light receiving element without intersecting the object and to the first light receiving element through the object, a pair of the first light emitting element and the first light receiving element and a pair of the first light emitting element and the second light receiving element form a first set, a pair of the second light emitting element and the first light receiving element and a pair of the second light emitting element and the second light receiving element form a second set, in the first set, the level of the light signal that is not attenuated by the object and is received by the first light receiving element is compared with the level of the light signal that is attenuated by the object and is received by the second light receiving element so as to detect information indicating whether there is the object, in the second set, the level of the light signal that is attenuated by the object and is received by the first light receiving element is compared with the level of the light signal that is not attenuated by the object and is received by the second light receiving element so as to detect information indicating whether there is the object, and the information obtained from the first set and the information obtained from the second set are checked so as to detect information indicating whether there is the object.

2. The photoelectric sensor according to claim 1,
wherein the comparison between the levels of the light signals in the first set is performed at a light emission timing of the first light emitting element, and
the comparison between the levels of the light signals in the second set is performed at a light emission timing of the second light emitting element.

3. The photoelectric sensor according to claim 1,
wherein, when the object is not detected by the check of the information indicating whether there is the object an abnormal state of the object-is detected.

4. The photoelectric sensor according to claim 1,
wherein the photoelectric sensor has a multi-stage structure and detects a plurality of objects,
the second light emitting element in the second set is used as the first light emitting element in the first set that is used to detect another object adjacent to the object subjected to a detecting process related to the second set, and
the second light receiving element in the second set is used as the first light receiving element in the first set that is used to detect the another object adjacent to the object subjected to a detecting process related to the second set.

5. The photoelectric sensor according to claim 1,
wherein a pair of the light emitting unit and the light receiving unit forms one unit.

6. A photoelectric sensor system comprising:
a plurality of the photoelectric sensors according to claim 1;
a first manager station that is connected to a series of the light emitting units; and
a second manager station that is connected to a series of the light receiving units corresponding to the light emitting units,
wherein the first manager station generates the light emission timing signal, and
the second manager station generates a timing signal of a received light signal synchronized with the light emission timing signal.

7. The photoelectric sensor system according to claim 6,
wherein a plurality of light emitting units and light receiving units among a series of the light emitting units and a series of the light receiving units is connected to a common data signal line, and
information indicating whether there is an object and information of the abnormal state of the object and/or a sensor failure are transmitted to a host parent station.

8. A photoelectric sensor system comprising:
the photoelectric sensor according to claim 1,
wherein, when the object is not detected by the check of the information indicating whether there is the object, a sensor failure is detected.

9. The photoelectric sensor according to claim 3,
wherein the photoelectric sensor has a multi-stage structure and detects a plurality of objects,
the second light emitting element in the second set is used as the first light emitting element in the first set that is used to detect another object adjacent to the object subjected to a detecting process related to the second set, and
the second light receiving element in the second set is used as the first light receiving element in the first set that is used to detect the another object adjacent to the object subjected to a detecting process related to the second set.

10. The photoelectric sensor according to claim 3,
wherein a pair of the light emitting unit and the light receiving unit forms one unit.

11. The photoelectric sensor according to claim 4,
wherein a pair of the light emitting unit and the light receiving unit forms one unit.

12. A photoelectric sensor system comprising:
a plurality of the photoelectric sensors according to claim 3;
a first manager station that is connected to a series of the light emitting units; and
a second manager station that is connected to a series of the light receiving units corresponding to the light emitting units,
wherein the first manager station generates the light emission timing signal, and
the second manager station generates a timing signal of a received light signal synchronized with the light emission timing signal.

13. A photoelectric sensor system comprising:
a plurality of the photoelectric sensors according to claim 4;
a first manager station that is connected to a series of the light emitting units; and
a second manager station that is connected to a series of the light receiving units corresponding to the light emitting units,
wherein the first manager station generates the light emission timing signal, and
the second manager station generates a timing signal of a received light signal synchronized with the light emission timing signal.

14. A photoelectric sensor system comprising:
a plurality of the photoelectric sensors according to claim 5;
a first manager station that is connected to a series of the light emitting units; and
a second manager station that is connected to a series of the light receiving units corresponding to the light emitting units,
wherein the first manager station generates the light emission timing signal, and
the second manager station generates a timing signal of a received light signal synchronized with the light emission timing signal.

15. A photoelectric sensor system comprising:
a plurality of the photoelectric sensors according to claim 9;
a first manager station that is connected to a series of the light emitting units; and
a second manager station that is connected to a series of the light receiving units corresponding to the light emitting units,
wherein the first manager station generates the light emission timing signal, and
the second manager station generates a timing signal of a received light signal synchronized with the light emission timing signal.

16. A photoelectric sensor system comprising:
a plurality of the photoelectric sensors according to claim 10;
a first manager station that is connected to a series of the light emitting units; and
a second manager station that is connected to a series of the light receiving units corresponding to the light emitting units,
wherein the first manager station generates the light emission timing signal, and the second manager station generates a timing signal of a received light signal synchronized with the light emission timing signal.

17. A photoelectric sensor system comprising:
a plurality of the photoelectric sensors according to claim 11;
a first manager station that is connected to a series of the light emitting units; and
a second manager station that is connected to a series of the light receiving units corresponding to the light emitting units,
wherein the first manager station generates the light emission timing signal, and the second manager station generates a timing signal of a received light signal synchronized with the light emission timing signal.

18. A photoelectric sensor, comprising:
a light emitting unit and a light receiving unit that are arranged opposite to each other,
wherein the light receiving unit includes a controller;
the photoelectric sensor detects whether there is an object in a space between the light emitting unit and the light receiving unit on the basis of a variation in the intensity of light signals received by the light receiving unit,
the light emitting unit includes:
a first light emitting element that emits a light signal to the light receiving unit without intersecting the object; and
a second light emitting element that emits a light signal to the light receiving unit through the object,
the level of a received time-division light signal generated by receiving the light signal which is emitted from the first light emitting element and is not attenuated by the object is compared by the controller with the level of a received time-division light signal generated by receiving the light signal which is emitted from the second light emitting element and is attenuated by the object to detect the information indicating whether there is the object.

19. The photoelectric sensor according to claims 18,
wherein the photoelectric sensor has a multi-stage structure and detects a plurality of objects,
the second light emitting element is used as the first light emitting element related to another object adjacent to the object intersected by the light signal emitted from the second light emitting element, and
the second light receiving element is used as the first light receiving element related to the another object adjacent to the object intersected by the light signal emitted from the second light emitting element.

20. A photoelectric sensor, comprising:
a light emitting unit and a light receiving unit that are arranged opposite to each other,
wherein the photoelectric sensor detects whether there is an object in a space between the light emitting unit and the light receiving unit on the basis of a variation in the intensity of light-signals received by the light receiving unit, and the emitting unit includes first and second light emitting elements,
the light receiving unit includes:
a controller;
a first light receiving element that receives a light signal which is emitted from the first light emitting element and is not attenuated by the object and a light signal which is emitted from the second light emitting element and is attenuated by the object; and
a second light receiving element that receives a light signal which is emitted from the second light emitting element and is not attenuated by the object and a light signal which is emitted from the first light emitting element and is attenuated by the object,
a pair of the first light emitting element and the first light receiving element and a pair of the second light emitting element and the first light receiving element form a first set,
a pair of the second light emitting element and the second light receiving element and a pair of the first light emitting element and the second light receiving element form a second set,
in the first set, the level of a time-division light signal that is not attenuated by the object and is received by the first light receiving element is compared by the controller with the level of a time-division light signal that is attenuated by the object and is received by the first light receiving element so as to detect the information indicating whether there is the object,
in the second set, the level of a time-division light signal that is attenuated by the object and is received by the second light receiving element is compared by the controller with the level of a time-division light signal that is not attenuated by the object and is received by the second light receiving element so as to detect information indicating whether there is the object, and
the information obtained from the first set and the information obtained from the second set are checked so as to detect information indicating whether there is the object.

21. The photoelectric sensor according to claim 20,
wherein the comparison between the levels of the time-division light signals is performed at time-division light emission timings of the first light emitting element and the second lightemitting element.

* * * * *